(12) United States Patent
Penney et al.

(10) Patent No.: US 10,672,441 B2
(45) Date of Patent: Jun. 2, 2020

(54) GAP DETECTION FOR CONSECUTIVE WRITE OPERATIONS OF A MEMORY DEVICE

(71) Applicant: Micron Technology, Inc., Boise, ID (US)

(72) Inventors: Daniel B. Penney, Wylie, TX (US); Liang Chen, Allen, TX (US); David R. Brown, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/051,202

(22) Filed: Jul. 31, 2018

(65) Prior Publication Data
US 2019/0259433 A1 Aug. 22, 2019

Related U.S. Application Data

(60) Provisional application No. 62/631,760, filed on Feb. 17, 2018.

(51) Int. Cl.
*G11C 7/00* (2006.01)
*G11C 7/22* (2006.01)
(Continued)

(52) U.S. Cl.
CPC .............. *G11C 7/222* (2013.01); *G06F 13/18* (2013.01); *G11C 7/106* (2013.01); *G11C 7/109* (2013.01); *G11C 7/1036* (2013.01); *G11C 7/1039* (2013.01); *G11C 7/1063* (2013.01); *G11C 7/1066* (2013.01); *G11C 7/1072* (2013.01); *G11C 7/1084* (2013.01); *G11C 7/1093* (2013.01); *G11C 7/1096* (2013.01);
*G11C 7/22* (2013.01); *G11C 8/10* (2013.01); *G11C 8/18* (2013.01); *G11C 11/4074* (2013.01);
(Continued)

(58) Field of Classification Search
CPC ..... G11C 7/222; G11C 7/1036; G11C 7/1039; G11C 7/106; G11C 7/1063; G11C 7/1066; G11C 7/1072; G11C 7/1084; G11C 7/109; G11C 7/22; G11C 8/10; G11C 11/4074; G11C 11/4076; G06F 13/18; H04L 25/03057; H04L 25/03267
USPC ................................................. 365/193, 194
See application file for complete search history.

(56) References Cited

U.S. PATENT DOCUMENTS

| | | | |
|---|---|---|---|
| 6,202,119 B1 * | 3/2001 | Manning ............... | G11C 7/1039 711/5 |
| 6,400,625 B2 * | 6/2002 | Arimoto ................ | G11C 29/48 365/189.02 |

(Continued)

OTHER PUBLICATIONS

PCT International Search Report & Written Opinion for PCT Application No. PCT/US2018/055276 dated Jan. 31, 2019; 11 Pages.

*Primary Examiner* — Viet Q Nguyen
(74) *Attorney, Agent, or Firm* — Fletcher Yoder, P.C.

(57) ABSTRACT

Method and devices include a shifter that is configured to receive a write command for a memory device and is configured to produce multiple shifted write commands from the write command. Multiple flip-flops that are configured to receive a subset of the multiple shifted write commands from the shifter. The multiple flip-flops also are configured to output an indicator of whether subsequent write commands of the subset of write commands is asserted when the write command has completed shifting through the shifter as a write start signal.

20 Claims, 16 Drawing Sheets

(51) Int. Cl.

| | | |
|---|---|---|
| *G11C 7/10* | (2006.01) | |
| *G11C 11/4076* | (2006.01) | |
| *G11C 11/4093* | (2006.01) | |
| *G11C 8/18* | (2006.01) | |
| *G11C 8/10* | (2006.01) | |
| *G11C 11/4096* | (2006.01) | |
| *H04L 25/03* | (2006.01) | |
| *G06F 13/18* | (2006.01) | |
| *G11C 11/4074* | (2006.01) | |

(52) U.S. Cl.
CPC ...... *G11C 11/4076* (2013.01); *G11C 11/4093* (2013.01); *G11C 11/4096* (2013.01); *H04L 25/03057* (2013.01); *H04L 25/03267* (2013.01); *G11C 2207/229* (2013.01); *G11C 2207/2272* (2013.01)

(56) References Cited

U.S. PATENT DOCUMENTS

| | | | | |
|---|---|---|---|---|
| 6,634,002 | B1 * | 10/2003 | Furubeppu | G01R 31/2882 257/E21.526 |
| 8,406,079 | B2 * | 3/2013 | Kim | G11C 7/22 365/189.05 |
| 8,737,159 | B2 * | 5/2014 | Song | G11C 7/1018 365/230.08 |
| 9,230,621 | B2 * | 1/2016 | Shim | G11C 7/1072 |
| 9,865,317 | B2 * | 1/2018 | Ishibashi | G11C 8/18 |
| 9,892,770 | B2 * | 2/2018 | Bell | G06F 9/30156 |
| 9,997,220 | B2 * | 6/2018 | Miyano | G11C 7/1057 |
| 10,068,626 | B2 * | 9/2018 | Eaton | G11C 7/222 |
| 10,148,269 | B1 * | 12/2018 | Mazumder | G11C 11/4087 |
| 10,153,014 | B1 * | 12/2018 | Mazumder | G11C 29/022 |
| 10,360,951 | B1 * | 7/2019 | Penney | G11C 7/1087 |
| 10,431,294 | B2 * | 10/2019 | Penney | G11C 7/1036 |
| 10,452,319 | B1 * | 10/2019 | Penney | G11C 11/4087 |
| 10,490,241 | B2 * | 11/2019 | Penney | G11C 7/222 |
| 10,510,398 | B2 * | 12/2019 | Penney | G11C 7/1093 |
| 2002/0078294 | A1 * | 6/2002 | Tsuchida | G11C 7/1072 711/105 |
| 2003/0002378 | A1 * | 1/2003 | Uchida | G11C 7/1006 365/230.03 |
| 2005/0128828 | A1 * | 6/2005 | Lee | G11C 7/1039 365/194 |
| 2005/0254307 | A1 * | 11/2005 | Dietrich | G11C 7/1027 365/185.22 |
| 2006/0104150 | A1 * | 5/2006 | Yoshida | G11C 7/1051 365/230.01 |
| 2011/0242911 | A1 * | 10/2011 | Ko | G11C 7/1078 365/194 |
| 2011/0271133 | A1 * | 11/2011 | Kim | G11C 7/22 713/401 |
| 2012/0113728 | A1 * | 5/2012 | Kwon | G11C 7/1006 365/189.05 |
| 2013/0083617 | A1 * | 4/2013 | Song | G11C 7/1018 365/230.02 |
| 2014/0198591 | A1 | 7/2014 | Morgan et al. | |
| 2014/0258607 | A1 * | 9/2014 | Shim | G11C 7/1072 711/105 |
| 2014/0340969 | A1 * | 11/2014 | Jung | G11C 7/222 365/189.05 |
| 2014/0355361 | A1 | 12/2014 | Bell et al. | |
| 2016/0314823 | A1 * | 10/2016 | Bell | G11C 7/109 |
| 2017/0076761 | A1 * | 3/2017 | Shimizu | G11C 7/106 |
| 2018/0122440 | A1 * | 5/2018 | Manning | G11C 7/222 |
| 2018/0158509 | A1 * | 6/2018 | Kim | G11C 11/412 |
| 2019/0333552 | A1 * | 10/2019 | Hong | G11C 7/222 |

\* cited by examiner

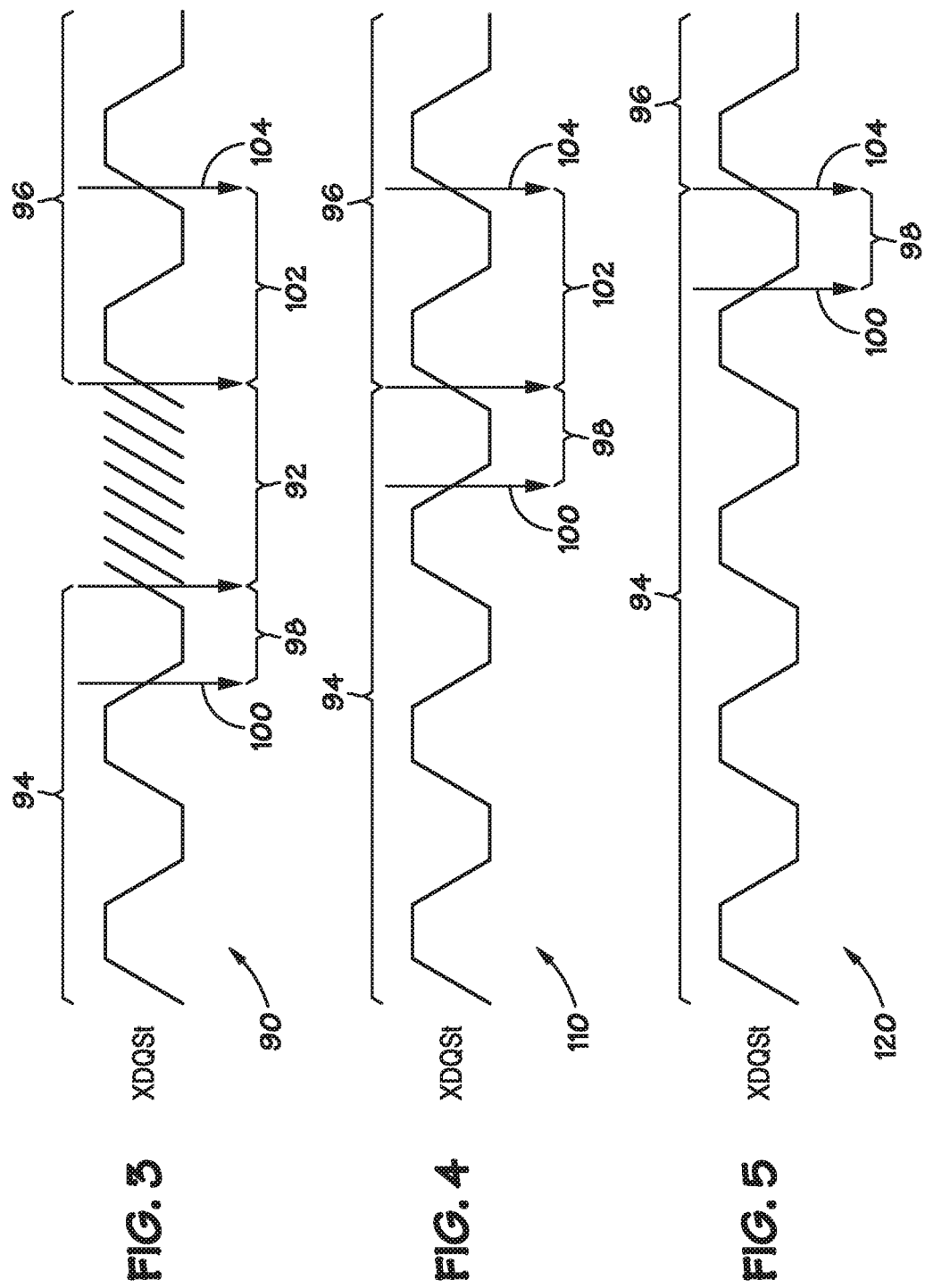

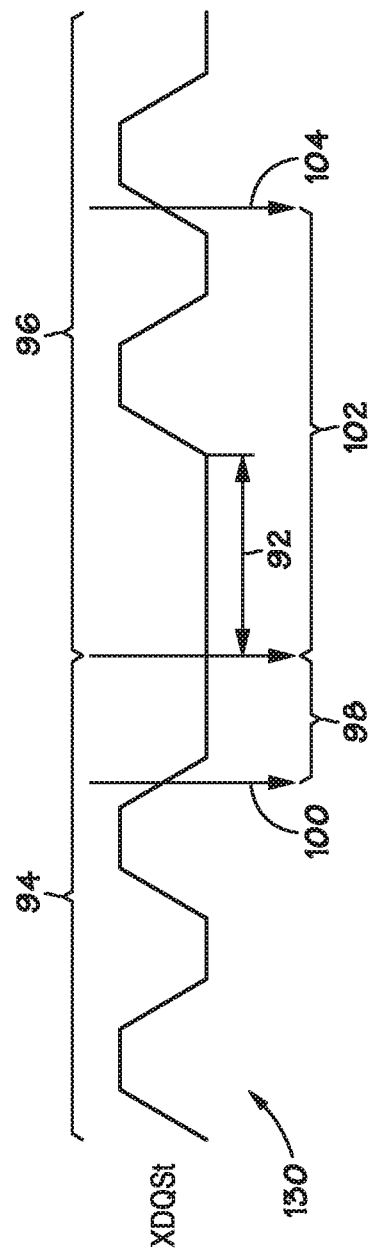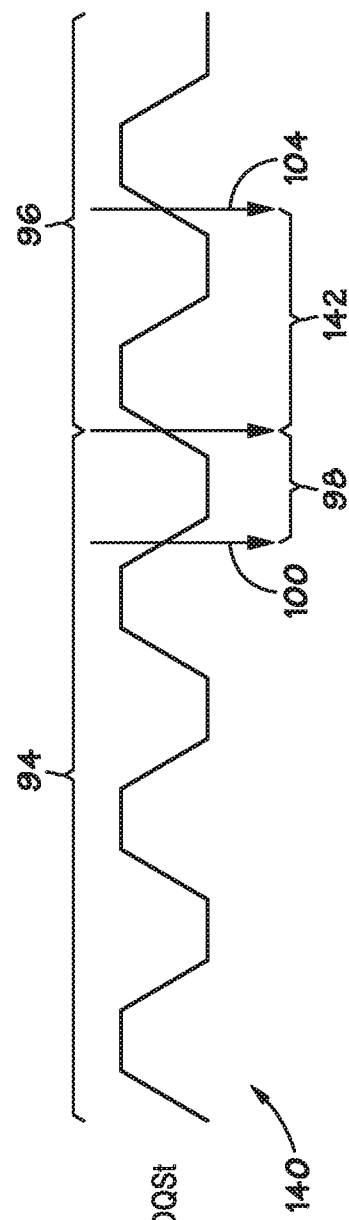

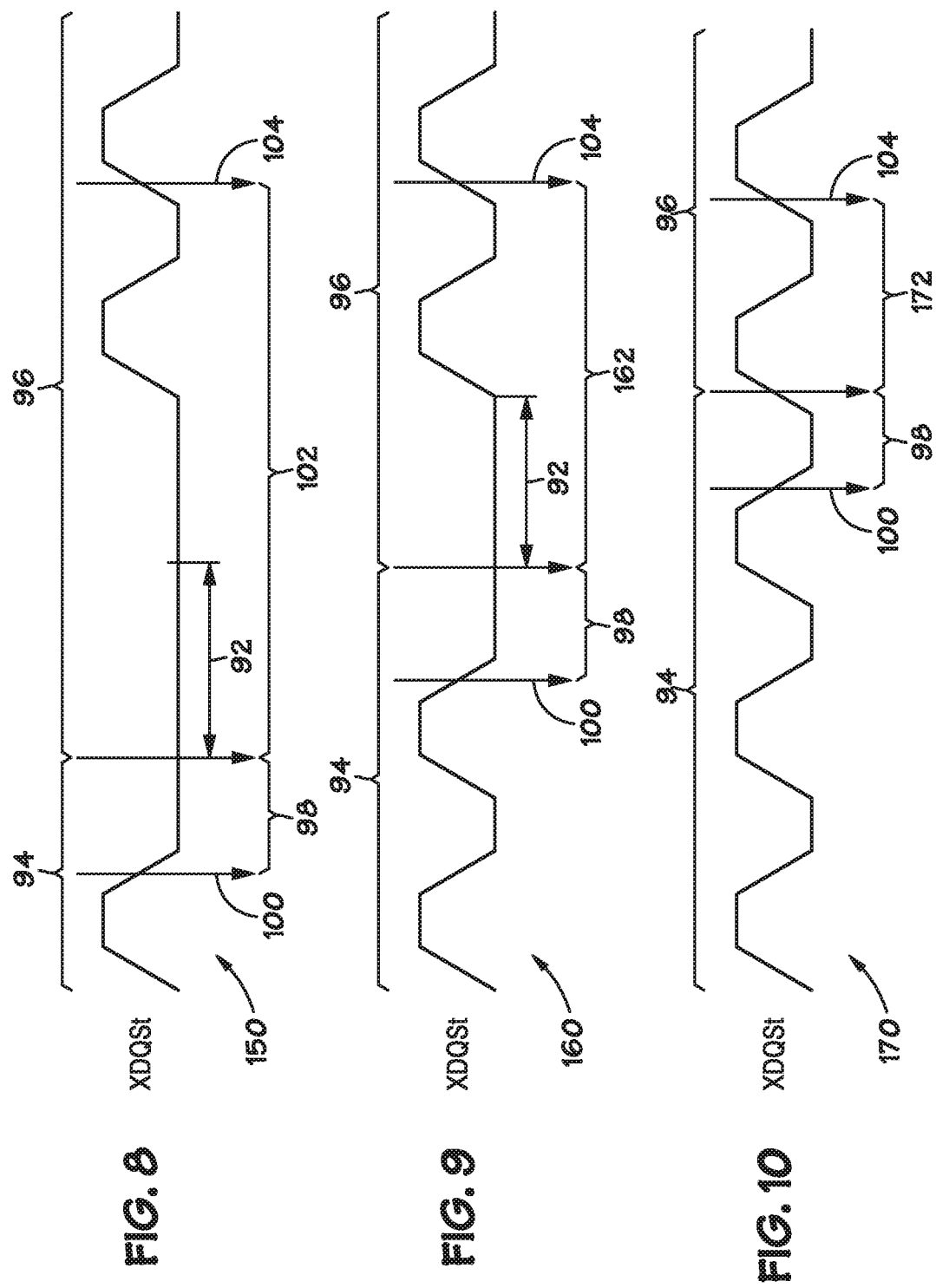

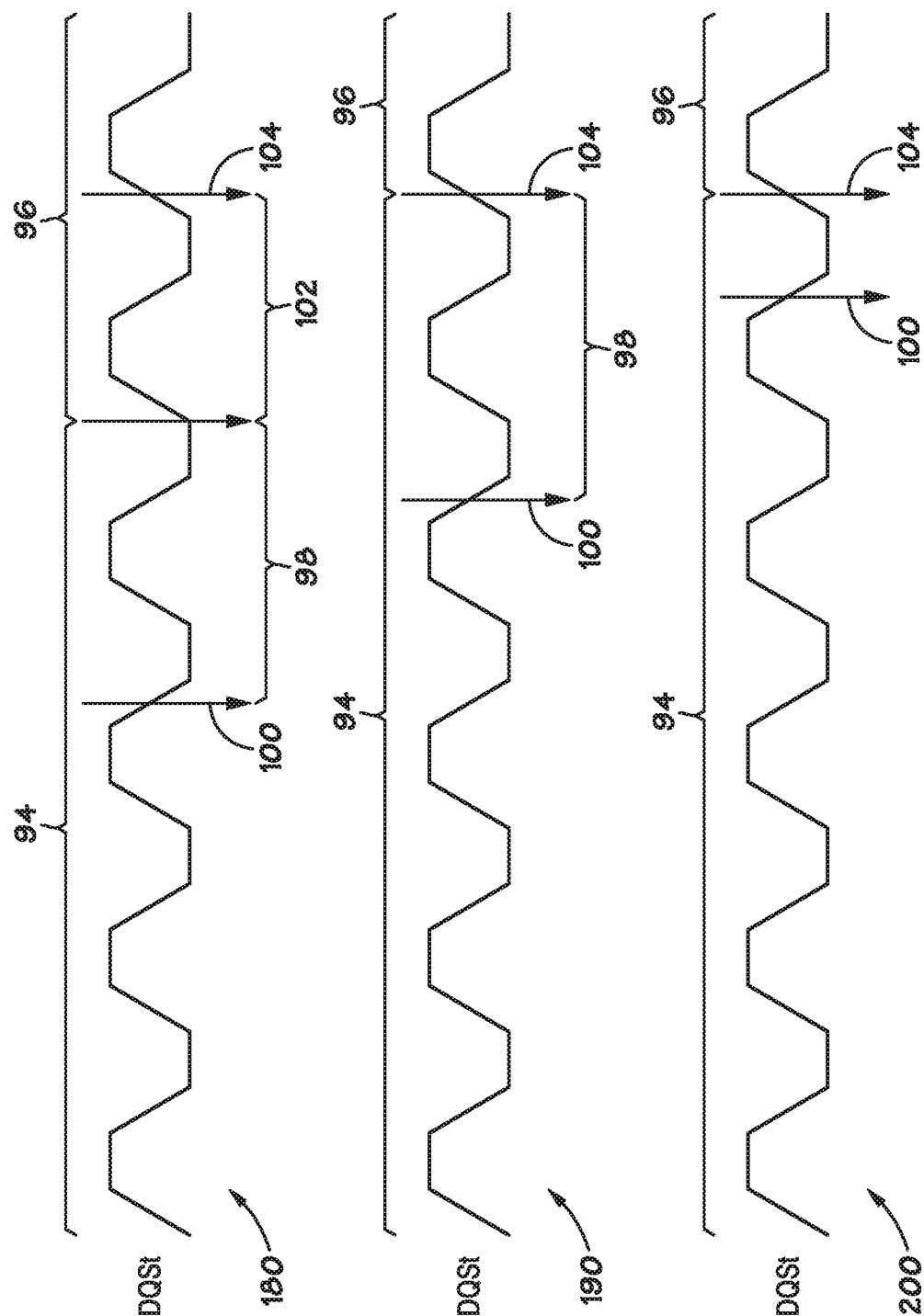

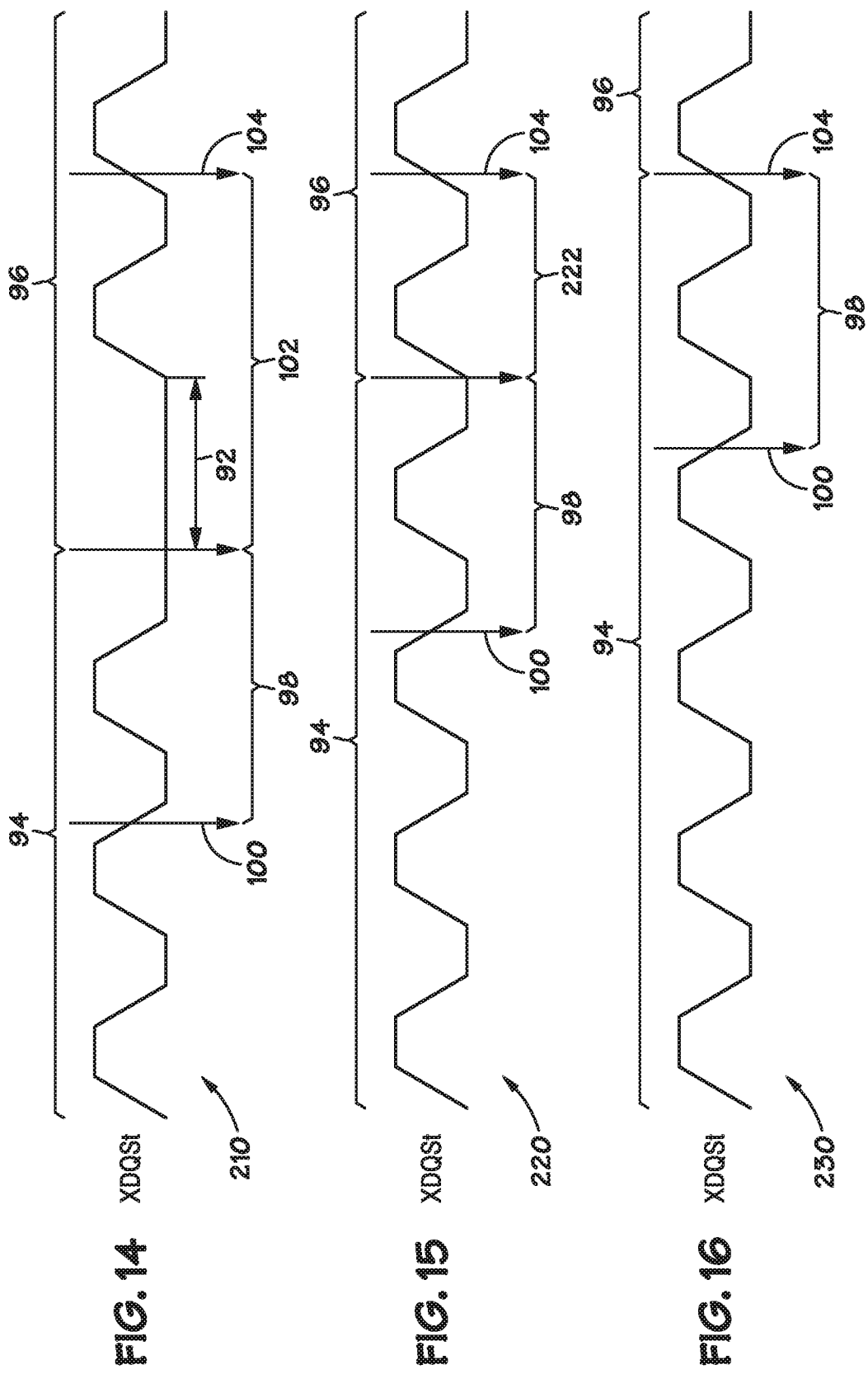

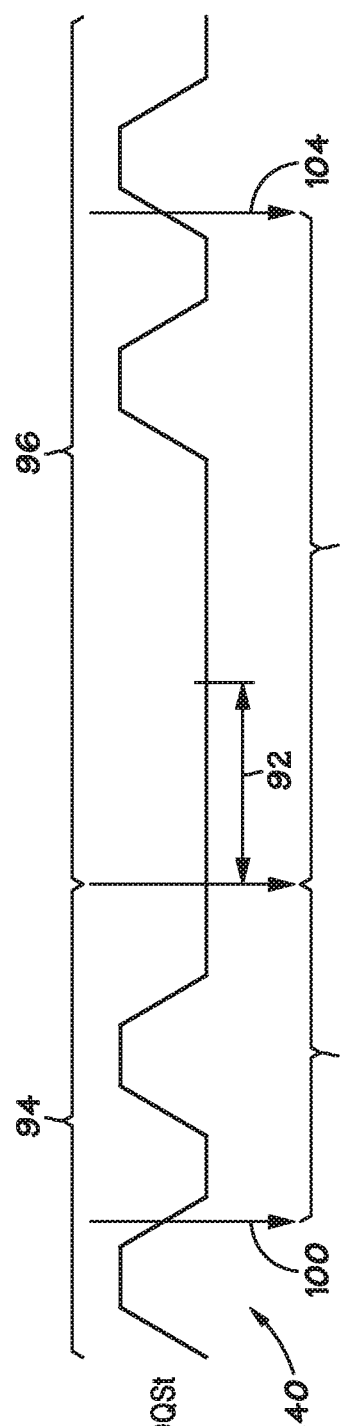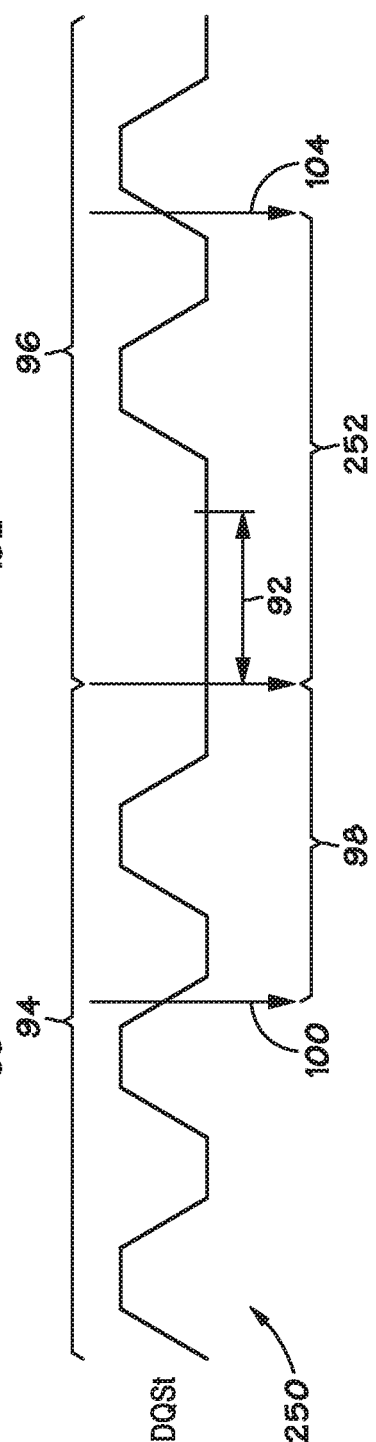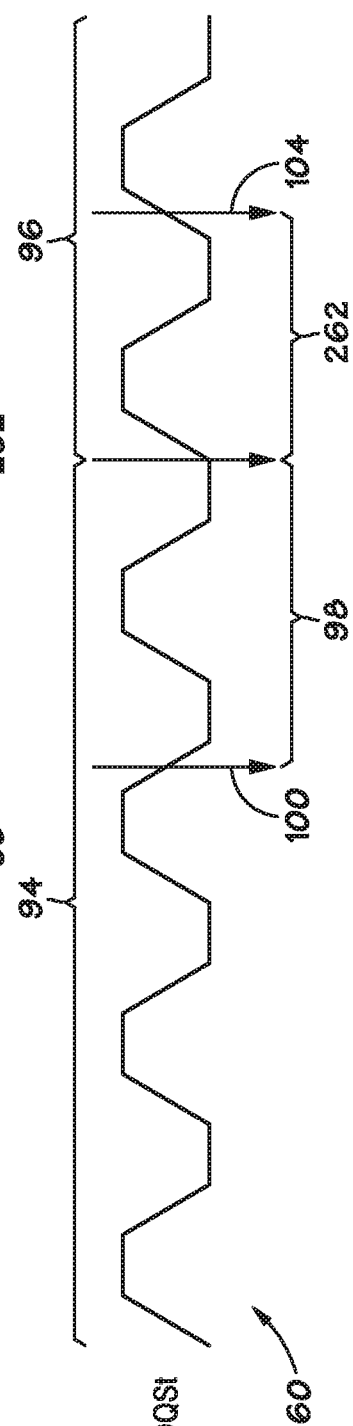

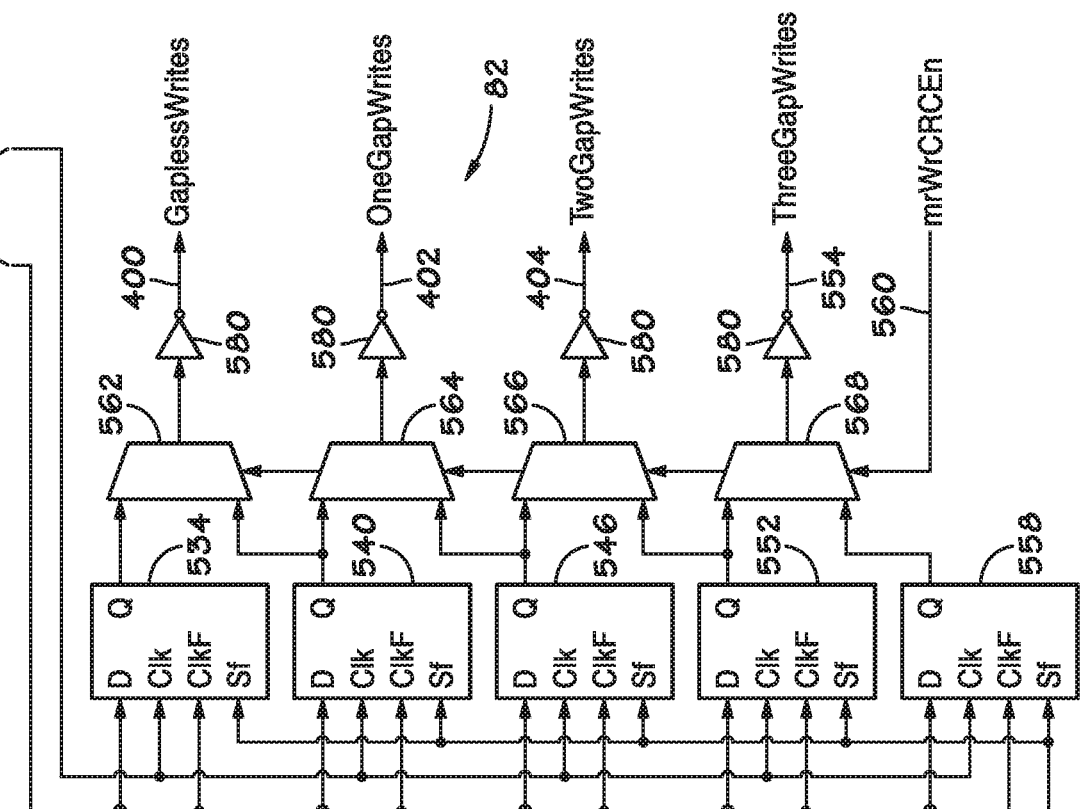
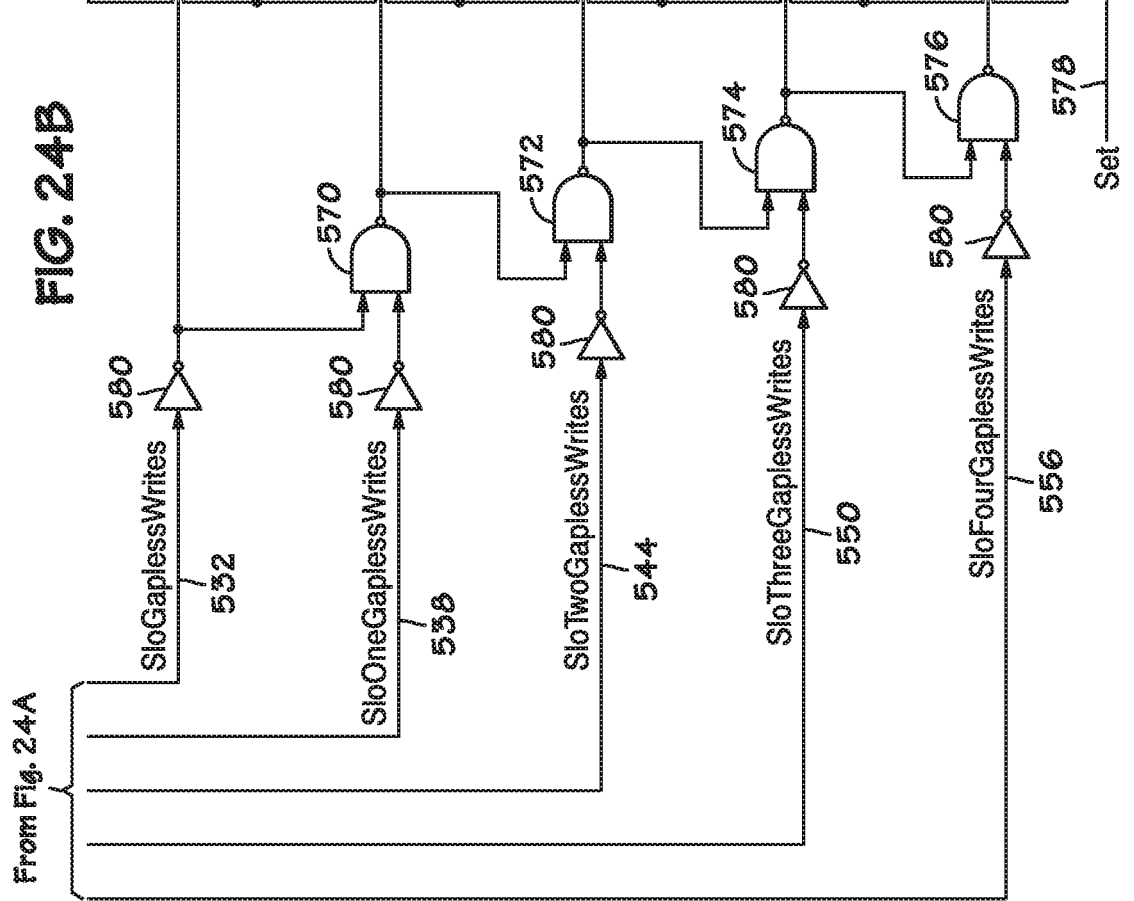
FIG. 24B

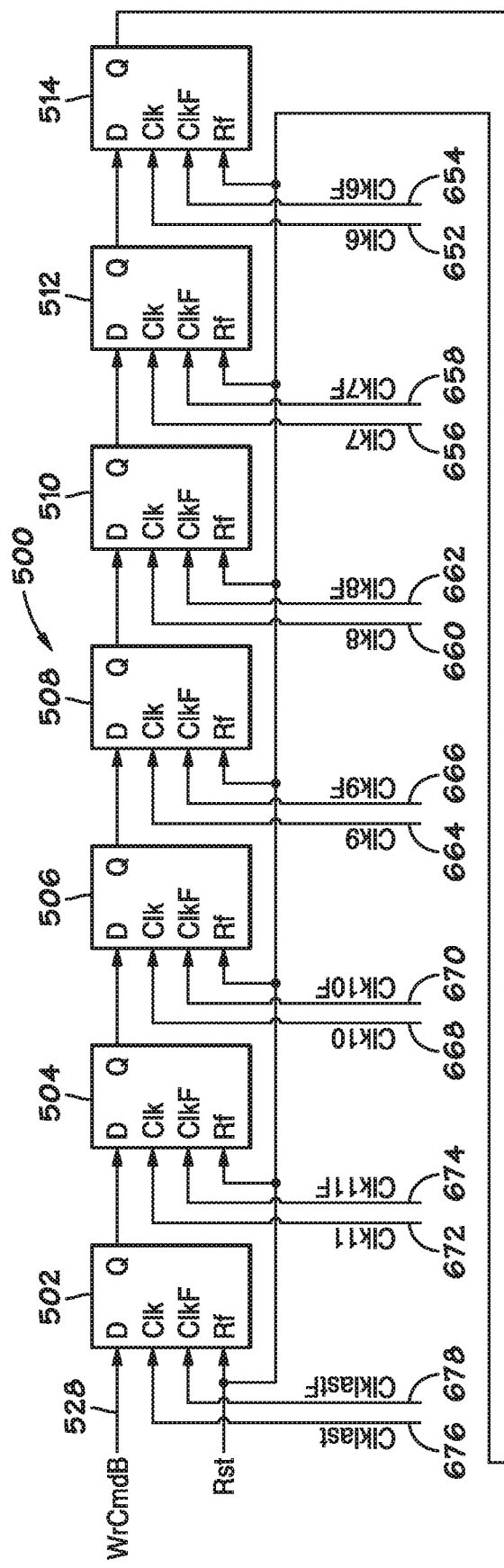
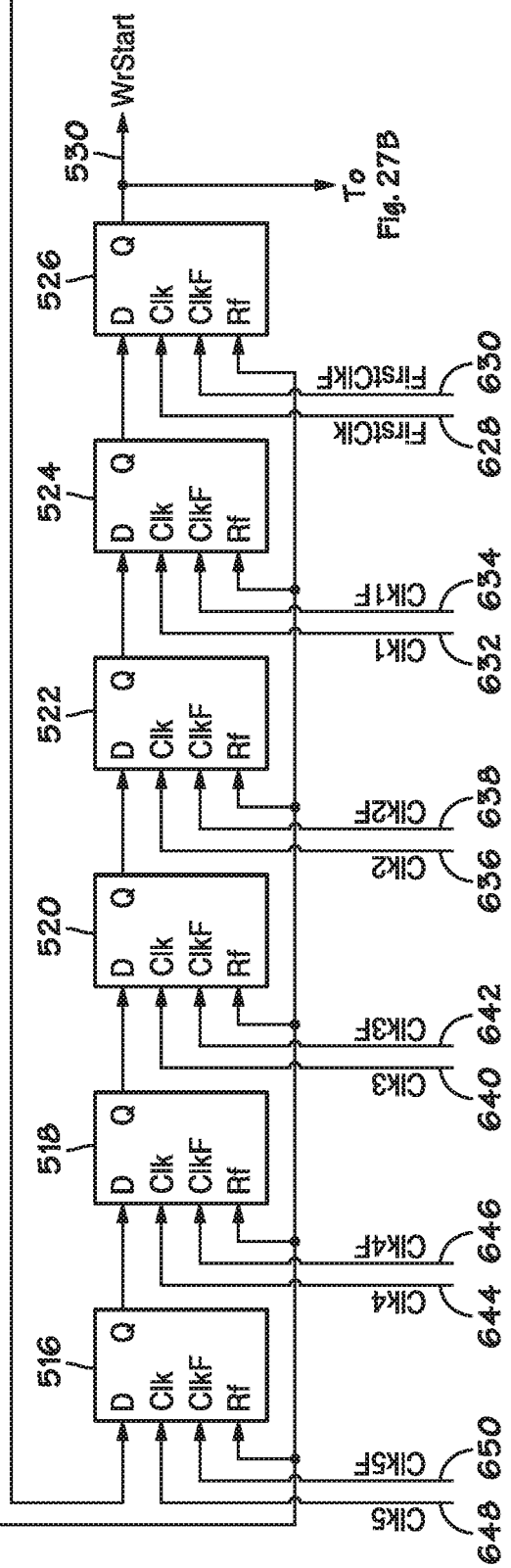
FIG. 27A

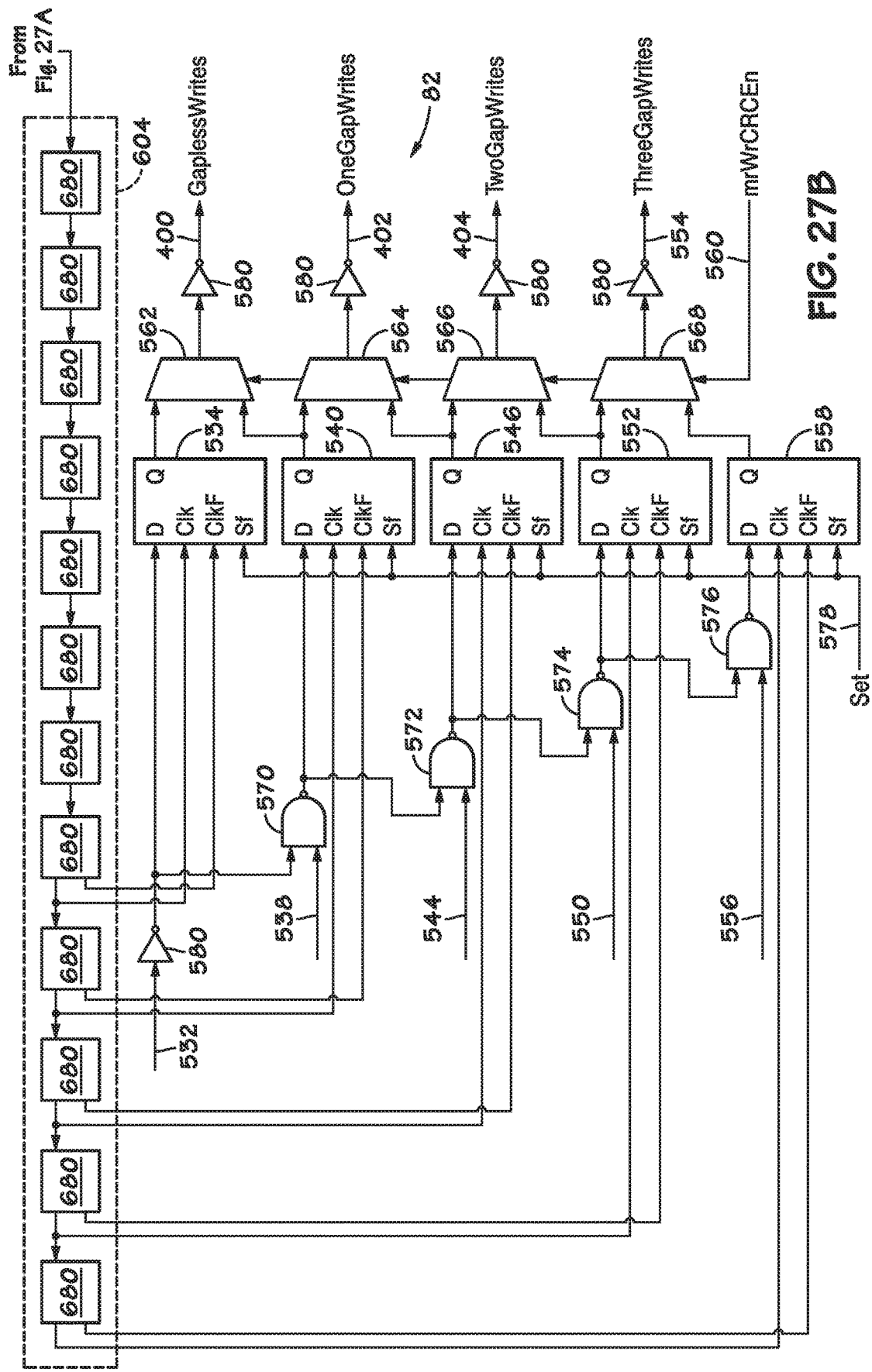

GAP DETECTION FOR CONSECUTIVE WRITE OPERATIONS OF A MEMORY DEVICE

CROSS-REFERENCE TO RELATED APPLICATIONS

This application claims priority to U.S. Provisional Patent Application 62/631,760, entitled "DDR5 Memory Device," and filed on Feb. 17, 2018, which this application incorporates entirely for all purposes.

BACKGROUND

Field of the Present Disclosure

Embodiments of the present disclosure relate generally to the field of gap detection between consecutive writes for memory devices. More specifically, embodiments of the present disclosure relate to outputting an indicator of a gap between consecutive write operations for memory devices.

Description of Related Art

Semiconductor devices (e.g., memory devices) utilize timing with phase shifts of data signals, data strobes, and/or other signals to perform operations (e.g., write operations). A decision feedback equalizer (DFE) may be used to maintain a buffer of a number (e.g., 4) of preceding data bits to improve accuracy in interpreting whether a current bit is high or low. For example, if the DFE has 4 previous low data bits stored, then a data line (DQ) will be at a lower voltage level, and the current data bit is to be interpreted as a logical high or a low relative to that level. However, contents of the DFE at the beginning (e.g., a first bit) of write operations may vary according to how closely spaced the write operations occur on the DQ.

Embodiments of the present disclosure may be directed to one or more of the problems set forth above.

BRIEF DESCRIPTION OF DRAWINGS

FIG. 3 is a timing diagram that may be used by the memory device of FIG. 1 with a 2 nCK gap between write operations with a programmed 0.5 nCK postamble and a programmed 1 nCK preamble, in accordance with an embodiment;

FIG. 4 is a timing diagram that may be used by the memory device of FIG. 1 with a 1 nCK gap between write operations with a programmed 0.5 nCK postamble and a programmed 1 nCK preamble, in accordance with an embodiment;

FIG. 5 is a timing diagram that may be used by the memory device of FIG. 1 with a 0 nCK gap between write operations with a programmed 0.5 nCK postamble and a programmed 1 nCK preamble, in accordance with an embodiment;

FIG. 6 is a timing diagram that may be used by the memory device of FIG. 1 with a 2 nCK gap between write operations with a programmed 0.5 nCK postamble and a programmed 2 nCK preamble, in accordance with an embodiment;

FIG. 7 is a timing diagram that may be used by the memory device of FIG. 1 with a 1 nCK gap between write operations with a programmed 0.5 nCK postamble and a programmed 2 nCK preamble, in accordance with an embodiment;

FIG. 8 is a timing diagram that may be used by the memory device of FIG. 1 with a 3 nCK gap between write operations with a programmed 0.5 nCK postamble and a programmed 3 nCK preamble, in accordance with an embodiment;

FIG. 9 is a timing diagram that may be used by the memory device of FIG. 1 with a 2 nCK gap between write operations with a programmed 0.5 nCK postamble and a programmed 3 nCK preamble, in accordance with an embodiment;

FIG. 10 is a timing diagram that may be used by the memory device of FIG. 1 with a 1 nCK gap between write operations with a programmed 0.5 nCK postamble and a programmed 3 nCK preamble, in accordance with an embodiment;

FIG. 11 is a timing diagram that may be used by the memory device of FIG. 1 with a 2 nCK gap between write operations with a programmed 1.5 nCK postamble and a programmed 1 nCK preamble, in accordance with an embodiment;

FIG. 12 is a timing diagram that may be used by the memory device of FIG. 1 with a 1 nCK gap between write operations with a programmed 1.5 nCK postamble and a programmed 1 nCK preamble, in accordance with an embodiment;

FIG. 13 is a timing diagram that may be used by the memory device of FIG. 1 with a 0 nCK gap between write operations with a programmed 1.5 nCK postamble and a programmed 1 nCK preamble, in accordance with an embodiment;

FIG. 14 is a timing diagram that may be used by the memory device of FIG. 1 with a 3 nCK gap between write operations with a programmed 1.5 nCK postamble and a programmed 2 nCK preamble, in accordance with an embodiment;

FIG. 15 is a timing diagram that may be used by the memory device of FIG. 1 with a 2 nCK gap between write operations with a programmed 1.5 nCK postamble and a programmed 2 nCK preamble, in accordance with an embodiment;

FIG. 16 is a timing diagram that may be used by the memory device of FIG. 1 with a 1 nCK gap between write operations with a programmed 1.5 nCK postamble and a programmed 2 nCK preamble, in accordance with an embodiment;

FIG. 17 is a timing diagram that may be used by the memory device of FIG. 1 with a 4 nCK gap between write operations with a programmed 1.5 nCK postamble and a programmed 3 nCK preamble, in accordance with an embodiment;

FIG. 18 is a timing diagram that may be used by the memory device of FIG. 1 with a 3 nCK gap between write operations with a programmed 1.5 nCK postamble and a programmed 3 nCK preamble, in accordance with an embodiment;

FIG. 19 is a timing diagram that may be used by the memory device of FIG. 1 with a 2 nCK gap between write operations with a programmed 1.5 nCK postamble and a programmed 3 nCK preamble, in accordance with an embodiment;

FIG. 24B is a schematic diagram of a second part of the generation circuitry of FIG. 24A, in accordance with an embodiment;

FIG. 27A is a schematic diagram of a first part of generation circuitry using the walkback clock circuitry of FIG. 26 and walkback WrStart circuitry, in accordance with an embodiment;

FIG. 27B is a schematic diagram of a second part of the generation circuitry of FIG. 27A, in accordance with an embodiment.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A decision feedback equalizer (DFE) may utilize a DFE buffer to track previous data levels to interpret incoming data levels. Between write operations, this DFE buffer may be reset to an initial state (e.g., all high or low values) in the DFE buffer. However, some write operations may be closely spaced which may prevent complete resetting of the DFE buffer between write operations. Accordingly, a memory device incorporating the DFE may utilize reset circuitry to reset the DFE buffer unless suppression circuitry suppresses the reset for specific conditions. To implement resets/suppressions, generation circuitry may be used to detect a gap between consecutive write operations and generate an appropriate signal that controls whether the DFE buffer is reset or whether the reset is suppressed.

Figure 1:
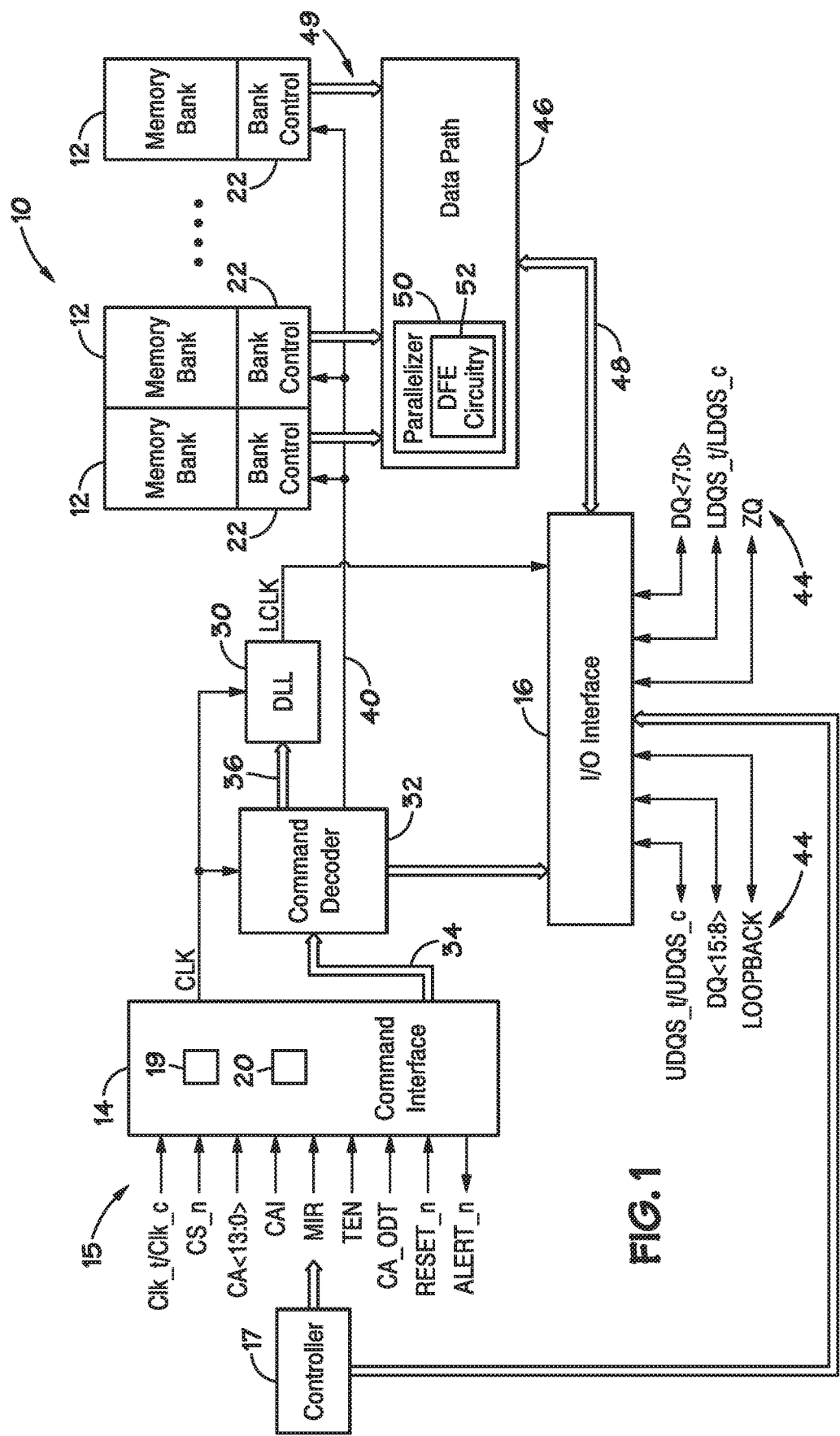
FIG. 1 is a simplified block diagram illustrating certain features of a memory device having a decision feedback equalizer (DFE) circuitry that determines a level for data received by the memory device, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a processor or controller 17. The processor or controller 17 may provide various signals 15 (including the DQ signals) to the memory device 10 to facilitate the transmission and receipt of data to be written to or read from the memory device 10.

As will be appreciated, the command interface 14 may include a number of circuits, such as a clock input circuit 19 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 19 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes multiple bi-directional data buses. Data IO signals, generally referred to as DQ signals, are generally transmitted and received in one or more bi-directional data busses. The datapath 46 may convert the DQ signals from a serial bus 48 to a parallel bus 49. For example, the datapath 46 may include a parallelizer 50 to translate the serial bus 48 to the parallel bus 49. The parallelizer 50 (and/or the IO interface 16) includes decision feedback engine (DFE) circuitry 52 that includes a buffer of a number (e.g., 4) of previous bits (e.g., high or low) that may be used to interpret incoming data bits in data IO signals, generally referred to as DQ signals. The DFE circuitry 52 uses the previous levels in the DQ signals to increase accuracy of interpreting incoming bits in the DQ signals.

For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 17 to the memory device 10 to strobe in write data. When the write operation is complete, the controller 17 will stop driving the DQS and allow it to float to an indeterminate tri-state condition. When the DQS signal is no longer driven by the controller 17, the external DQS signal from the controller 17 to the memory device 10 will be at an unknown/indeterminate state. This state can cause undesirable behavior inside the memory device 10 because an internal DQS signal inside the memory device 10 may be at an intermediate level and/or may oscillate. In some embodiments, even the external DQS signal may ring at the I/O interface 16 when the controller 17 stops driving the external DQS signal.

The DDR5 specification may include a short postamble period where the external DQS signal is still driven by the controller 17 after the last write data bit to allow time for disabling of write circuitry to propagate before the controller 17 ceases to drive the external DQS signal. The DDR5 specification may define a short (e.g., 0.5 tCK) postamble period and a long (e.g., 1.5 tCK) postamble period that may be selected using a mode register. However, the short postamble period may provide a short period of time to reset a DFE buffer.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

For DDR5, the DFE circuitry 52 for data input receivers of the DQ signals is specified to maintain a "history" buffer of a preceding number (e.g., 4) of data bits to interpret whether the current bit is interpreted as a high or a low. For example, if the preceding data bits were all low, the system data channel (DQ) data line will be at a lower voltage level and the current data bit is to be interpreted as a logical high or a low relative to that level.

However, some new writes may have no preceding data. For any new write where there is no preceding data, the DFE circuitry 52 is expected to have been placed into a reset condition such that the "history" buffer of bits is at a pre-arranged level (e.g., high or low). The host sets the system data channel (DQ) line to be at the proper voltage level, such as high at the positive rail, in order to correspond to the pre-arranged buffer condition.

DDR5 allows write operations to be performed consecutively such that data entry is gapless between two consecutive writes. In this case, the normal postamble for the first write operation and/or the normal preamble for the second write operation may be completely eliminated. For some consecutive write operations, there may be cycle gaps having a certain gap (e.g., 1, 2, 3, or more cycles) between the data burst of the first write operation and the data burst of the second write operation. For these cases, there may be a specified partial postamble and/or partial preamble to support these operations.

In some consecutive write operations, the spacing between the first write operation and the second write operation is such that the entire first postamble and second preamble is met and there may even be additional clock cycles in between the two write operations. When there are additional clock cycles in between the first postamble and second preamble, the DQS strobe may be disabled (float) or driven depending on the specification. Thus, the DFE circuitry 52 may reset the DFE buffer at the end of a write burst using reset circuitry when sufficient time to reset occurs between write operations, but the reset may be at least partially suppressed when there is insufficient time (e.g., less than 2 DQS cycles) between write operations. As noted below, when the DFE reset is suppressed at the end of a write burst, the DFE buffer may instead be populated using data strobed in using the available DQS cycles. For example, in a suppression of a reset of a 4-bit DFE buffer when 2 DQS cycles occur between write operations, 4 bits (on rising and falling edges of the DQS cycles) of "not live" data existing on the data line may be written into the DFE buffer. Moreover, in a suppression of a reset of a 4-bit DFE buffer when only a single cycle occurs between write operations, 2 bits (on rising and falling edges of the DQS cycle) may be written into the DFE buffer even though the buffer may only be halfway overwritten with "not live" data.

Figure 2:
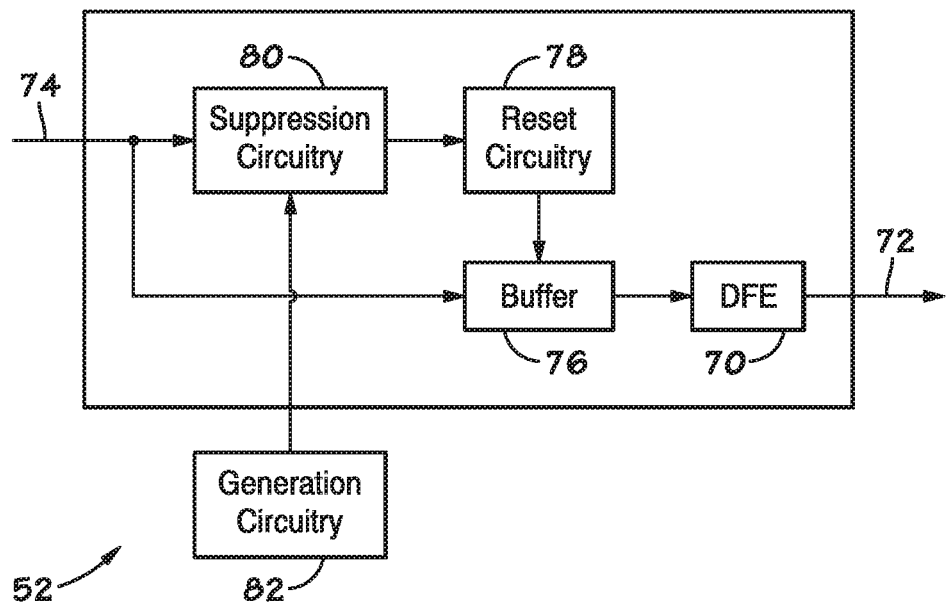
FIG. 2 is a schematic diagram of the DFE circuitry of FIG. 1, in accordance with an embodiment.

FIG. 2 illustrates a schematic diagram of an embodiment of the DFE circuitry 52. As previously noted, the DFE circuitry 52 utilizes a DFE 70 to determine a relative level of data 72 based on incoming data 74 (e.g., DQ). Also, as noted, the DFE circuitry 52 utilizes a DFE buffer 76 to implement the functions of the DFE 70. The DFE buffer 76 may have any suitable number of "taps" storing previous data points. For example, the DFE buffer 76 may include 1, 2, 3, 4, or more taps corresponding to historical/previous levels of the incoming data 74. The DFE circuitry 52 also utilizes reset circuitry 78 to reset the DFE buffer 76 after each write operation to a preset level. For example, the reset circuitry 78 may be used to set the taps of the DFE buffer 76 to all high values or all low values. Since complete reset using the reset circuitry 78 may not be practical with write operations that occur relatively closely together, the DFE circuitry 52 may utilize suppression circuitry 80 to suppress the reset for certain cases. In some embodiments, the reset circuitry 78 and the suppression circuitry 80 may be combined into a single logical circuit that performs resets and suppressions of resets. The DFE circuitry 52 receives control signal from generation circuitry 82 that controls behavior of the suppression circuitry 80. The DFE circuitry 52 may include the generation circuitry 82. Alternatively, the generation circuitry 82 may be included in a different location in the memory device 10. Additionally or alternatively, the generation circuitry 82 may be included in host device (e.g., controller) that is coupled to the memory device 10 so that the host device transmits the control signals to the memory device 10 along with the data being written.

Example Timing Diagrams Implemented in the Memory Device

FIGS. 3-19 illustrate timing diagrams of various cases that may occur in the memory device 10 to be addressed by the DFE circuitry 52. FIGS. 3-19 illustrate timing diagrams relative to an external DQS signal. For instance, FIGS. 3-5 illustrate timings that may be used when the memory device 10 has specified 0.5 nCK write postambles and 1 nCK write preambles for write operations. Similarly, FIGS. 6 and 7 illustrate timings that may be used when the memory device 10 has specified 0.5 nCK write postambles and 2 nCK write preambles for write operations. FIGS. 8-10 illustrate timings that may be used when the memory device 10 has specified 0.5 nCK write postambles and 3 nCK write preambles for write operations. FIGS. 11-13 illustrate timings that may be used when the memory device 10 has specified 1.5 nCK write postambles and 1 nCK write preambles for write operations. FIGS. 14-16 illustrate timings that may be used when the memory device has specified 1.5 nCK write postambles and 2 nCK write preambles. FIGS. 17-19 illustrate timings that may be used when the memory device 10 has specified 1.5 nCK write postambles and 2 nCK write preambles for write operations. Furthermore, when the duration between data bits in write operations is too small to allow for both a specified preamble and postamble, the preamble and/or the postamble may be shortened from the specified duration. Indeed, in some cases, the preamble and/or the postamble may be entirely omitted. When the postamble and/or the preamble is shortened or omitted, the timings used for the memory device 10 may appear similar to timings that may be used for shorter specified write postambles and/or shorter specified write preambles.

Specification of Write Postambles of 0.5 nCK DQS and Write Preambles of 1 nCK DQS Returning to FIG. 3, the timing diagram 90 illustrates a sufficient reset period 92 between a first write operation 94 and a second write operation 96. The first write operation 94 includes a write postamble 98 that occurs after a last bit capture 100 when a last write bit of the first write operation 94 is captured. The second write operation 96 includes a write preamble 102 that occurs before a first bit capture 104 where the first bit of the second write operation 96 is captured.

Furthermore, as illustrated in the timing diagram 90, a 0.5 nCK postamble 98 of the first write operation 94 occurs after the last bit capture 100 of the first write operation 94. Moreover, as illustrated, the preamble 102 has a 1 nCK duration for the second write operation 96. The reset period 92 occurs during a 2 nCK (or greater) gap between the last bit capture 100 and the first bit capture 104. During this period, the DFE buffer 76 may be reset completely using the reset circuitry 78 during the reset period 92. For example, the DFE buffer 76 may be initialized to all high (or all low) values during the reset period 92. Since reset period 92 occurs between the postamble 98 and the preamble 102, in some embodiments, the DQS signal may float to an indeterminate state.

FIG. 4 illustrates a timing diagram 110 similar to the timing diagram 90. However, the timing diagram 110 illustrates a 1 nCK gap between the last bit capture 100 and the first bit capture 104. This gap provides sufficient time for the 0.5 nCK postamble 98 and the 1 nCK preamble 102. However, this gap does not provide sufficient time to reset the DFE buffer 76 between the last bit capture 100 and the first bit capture 104. Accordingly, data incidentally occurring on the DQ line may be strobed into the DFE buffer 76 as non-target data latched for DFE initialization.

FIG. 5 illustrates a timing diagram 120 similar to the timing diagram 90. However, the timing diagram 120 illustrates a 0 nCK gap between the last bit capture 100 and the first bit capture 104. This gap provides sufficient time for the 0.5 nCK postamble 98, but it does not provide sufficient time for the specified duration of 1 nCK allocated for the preamble 102. Thus, the preamble 102 is not included in the timing diagram 110. In some embodiments, the postamble 98 may be omitted in place of or in addition to the omission of the preamble 102. For instance, the preamble 102 is omitted in the timing diagram 110 rather than omitting the postamble 100 since omission of the preamble 102 provides sufficient timing relief to accommodate the 0 nCK gap between write operations. Omission of the postamble 100 would not provide sufficient timing relief. Furthermore, this gap does not provide sufficient time to reset the DFE buffer 76 between the last bit capture 100 and the first bit capture 104. Additionally, since no gap exists, the DFE circuitry 52 may continue operation using the values in the DFE buffer 76 between the first write operation 94 and the second write operation 96.

Write Postambles of 0.5 nCK DQS and Write Preambles of 2 nCK DQS

FIG. 6 illustrates a timing diagram 130 similar to the timing diagram 90. Similar to the timing diagram 90, the timing diagram 130 illustrates a 2 nCK gap between the last bit capture 100 and the first bit capture 104. However, in the timing diagram 130, the write operations 94, 96 are specified with a 0.5 nCK postamble 98 and 2 nCK preamble 102. The gap of 2 nCK provides sufficient time for the 0.5 nCK postamble 98 and the 2 nCK preamble 102. The timing diagram 130 also illustrates that the reset period 92 may occur during the preamble 102. Additionally or alternatively, at least a portion of the reset period 92 may occur during the postamble 98.

FIG. 7 illustrates a timing diagram 140 similar to the timing diagram 130. However, the timing diagram 140 illustrates a 1 nCK gap between the last bit capture 100 and the first bit capture 104. This gap provides sufficient time for the 0.5 nCK postamble 98, but it does not provide sufficient time for the specified duration of 2 nCK allocated for the preamble 102. Thus, only a portion of the preamble 102 is included in the timing diagram 140 as a partial preamble 142. Furthermore, this gap does not provide sufficient time to reset the DFE buffer 76 by setting the DFE buffer 76 to all high or all low values between the last bit capture 100 and the first bit capture 104. Instead, the reset circuitry 78 may store bits from the DQ in the DFE buffer 76 during the postamble 98 and/or the preamble 102.

When no cycles exist between the last bit capture 100 and the first bit capture 104, the preamble 102 may be completely omitted while the 0.5 nCK postamble is included. Thus, in such a situation, the memory device 10 may utilize the timing diagram 120 of FIG. 5.

Write Postambles of 0.5 nCK DQS and Write Preambles of 3 nCK DQS

FIG. 8 illustrates a timing diagram 150 similar to the timing diagram 90. However, the timing diagram 130 illustrates a 3 nCK gap between the last bit capture 100 and the first bit capture 104. Furthermore, in the timing diagram 150, the write operations 94, 96 are specified with a 0.5 nCK postamble 98 and 3 nCK preamble 102. The gap of 3 nCK provides sufficient time for the 0.5 nCK postamble 98 and the 3 nCK preamble 102. The timing diagram 150 also illustrates that the reset period 92 may occur during the preamble 102. Additionally or alternatively, at least a portion of the reset period 92 may occur during the postamble 98.

FIG. 9 illustrates a timing diagram 160 similar to the timing diagram 150. However, the timing diagram 160 illustrates a 2 nCK gap between the last bit capture 100 and the first bit capture 104. Furthermore, in the timing diagram 160, the write operations 94, 96 are specified with a 0.5 nCK postamble 98 and 3 nCK preamble 102. However, the gap of 2 nCK does not provide sufficient time for the 0.5 nCK postamble 98 and the 3 nCK preamble 102. Thus, the timing diagram 160 includes a partial preamble 162 that is 2 nCK in duration. The timing diagram 160 also illustrates that the reset period 92 may occur during the partial preamble 162. Additionally or alternatively, at least a portion of the reset period 92 may occur during the postamble 98.

FIG. 10 illustrates a timing diagram 170 similar to the timing diagram 150 in that the write operations 94, 96 are specified with a 0.5 nCK postamble 98 and 3 nCK preamble 102. However, the timing diagram 170 includes only a 1 nCK gap that does not provide sufficient time to implement the 0.5 nCK postamble 98 and the entire 3 nCK preamble 102. Thus, the full preamble may not be included. Instead, a partial preamble 172 having a duration of 1 nCK is included. During the postamble 98 and/or the preamble 172, non-target data on the DQ may be latched to the DFE buffer 76 as initialization of the DFE buffer 76 for the write operation 96.

If no cycles exist between the last bit capture 100 and the first bit capture 104 when a 3 nCK preamble is specified, the preamble 102 may be completely omitted resulting in the memory device 10 using the timing diagram 120 of FIG. 5.

Write Postambles of 1.5 nCK DQS and Write Preambles of 1 nCK DQS

FIG. 11 illustrates a timing diagram 180 similar to the timing diagram 90. Similar to the timing diagram 90, the timing diagram 180 illustrates a 2 nCK gap between the last bit capture 100 and the first bit capture 104. However, in the timing diagram 180, the write operations 94, 96 are specified with a 1.5 nCK postamble 98 and 1 nCK preamble 102. The gap of 2 nCK provides sufficient time for the 1.5 nCK postamble 98 and the 1 nCK preamble 102. However, the reset of the DFE buffer 76 utilizes non-target data latching for initialization for the write operation 96 since the preamble 102 (or any space before the preamble 102) does not provide sufficient time to perform the reset to all high or all low values.

FIG. 12 illustrates a timing diagram 190 similar to the timing diagram 180. However, the timing diagram 190 illustrates a 1 nCK gap between the last bit capture 100 and the first bit capture 104. This gap provides sufficient time for the 1.5 nCK postamble 98, but it does not provide sufficient time for the specified duration of 1 nCK allocated for the preamble 102. Thus, the preamble 102 is omitted. Furthermore, this gap does not provide sufficient time to reset the DFE buffer 76 by setting the DFE buffer 76 to all high or all low values between the last bit capture 100 and the first bit capture 104. Instead, the reset circuitry 78 may pulse in bits from the DQ in the DFE buffer 76 on edges of the DQS signal between the last bit capture 100 and the first bit capture 104.

FIG. 13 illustrates a timing diagram 200 similar to the timing diagram 180. However, the timing diagram 200 illustrates a 0 nCK gap between the last bit capture 100 and the first bit capture 104. This gap does not provide sufficient time for the specified duration of 1.5 nCK for the postamble 98 or the specified duration of 1 nCK allocated for the preamble 102. Thus, the postamble 98 and the preamble 102 are not included in the timing diagram 200 and are not used by the memory device 10 between the last bit capture 100 and the first bit capture 104. Furthermore, this gap does not provide sufficient time to reset the DFE buffer 76 between the last bit capture 100 and the first bit capture 104. Additionally, since no gap exists, the DFE circuitry 52 may continue operation using the values in the DFE buffer 76 between the first write operation 94 and the second write operation 96.

Write Postambles of 1.5 nCK DQS and Write Preambles of 2 nCK DQS

FIG. 14 illustrates a timing diagram 210 similar to the timing diagram 180 of FIG. 11. The timing diagram 210 illustrates a 3 nCK gap between the last bit capture 100 and the first bit capture 104. Similar to the timing diagram 180, in the timing diagram 210, the write operations 94, 96 are specified with a 1.5 nCK postamble 98, but in the timing diagram 210 the write operations 94, 96 have a specified length of 2 nCK for the preamble 102. The gap of 3 nCK provides sufficient time for the 1.5 nCK postamble 98 and the 2 nCK preamble 102. The preamble 102 and/or the postamble 98 includes the reset period 92 where all the bits in the DFE buffer 76 are reset (e.g., set to all high or all low values).

FIG. 15 illustrates a timing diagram 220 similar to the timing diagram 210. Similar to the timing diagram 210, the write operations 94, 96 are specified with a 1.5 nCK postamble 98 and a 2 nCK preamble 102. However, the timing diagram 220 illustrates a 2 nCK gap between the last bit capture 100 and the first bit capture 104. This gap provides sufficient time for the 1.5 nCK postamble 98, but it does not provide sufficient time for the specified duration of 2 nCK allocated for the preamble 102 with the 1.5 nCK postamble 98. Thus, a partial preamble 222 having a duration of 1 nCK is included. Furthermore, this gap does not provide sufficient time to reset the DFE buffer 76 by setting the DFE buffer 76 to all high or all low values between the last bit capture 100 and the first bit capture 104. Instead, the reset circuitry 78 may pulse in bits from the DQ in the DFE buffer 76 on edges of the DQS signal between the last bit capture 100 and the first bit capture 104 (during the postamble 98 and/or the partial preamble 222).

FIG. 16 illustrates a timing diagram 230 similar to the timing diagram 210. Similar to the timing diagram 210, the write operations 94, 96 are specified with a 1.5 nCK postamble 98 and a 2 nCK preamble 102. However, the timing diagram 230 illustrates a 1 nCK gap between the last bit capture 100 and the first bit capture 104. This gap provides sufficient time for the 1.5 nCK postamble 98, but it does not provide sufficient time for the specified duration of 2 nCK allocated for the preamble 102. Thus, the preamble 102 is omitted. During the postamble 98, the reset circuitry 78 may pulse in bits from the DQ in the DFE buffer 76 on edges of the DQS signal between the last bit capture 100 and the first bit capture 104.

If no cycles exist between the last bit capture 100 and the first bit capture 104 when a 2 nCK preamble is specified with a 1.5 nCK postamble, the preamble 102 and the postamble 98 may be completely omitted resulting in the memory device 10 using the timing diagram 200 of FIG. 13.

Write Postambles of 1.5 nCK DQS and Write Preambles of 3 nCK DQS

FIG. 17 illustrates a timing diagram 240 similar to the timing diagram 180 of FIG. 11. The timing diagram 240 illustrates a 4 nCK gap between the last bit capture 100 and the first bit capture 104. Similar to the timing diagram 180, in the timing diagram 240, the write operations 94, 96 are specified with a 1.5 nCK postamble 98, but in the timing diagram 240 the write operations 94, 96 have a specified length of 3 nCK for the preamble 102. The gap of 4 nCK provides sufficient time for the 1.5 nCK postamble 98 and the 3 nCK preamble 102. The preamble 102 and/or the postamble 98 includes the reset period 92 where all the bits in the DFE buffer 76 are reset (e.g., set to all high or all low values).

FIG. 18 illustrates a timing diagram 250 similar to the timing diagram 240. Similar to the timing diagram 240, the write operations 94, 96 are specified with a 1.5 nCK postamble 98 and a 3 nCK preamble 102. However, the timing diagram 250 illustrates a 3 nCK gap between the last bit capture 100 and the first bit capture 104. This gap provides sufficient time for the 1.5 nCK postamble 98, but it does not provide sufficient time for the specified duration of 3 nCK allocated for the preamble 102 with the 1.5 nCK postamble 98. Thus, a partial preamble 252 having a duration of 2 nCK is included instead of the preamble 102. The partial preamble 252 and/or the postamble 98 includes the reset period 92 where all the bits in the DFE buffer 76 are reset (e.g., set to all high or all low values).

FIG. 19 illustrates a timing diagram 260 similar to the timing diagram 240. Similar to the timing diagram 240, the write operations 94, 96 are specified with a 1.5 nCK postamble 98 and a 3 nCK preamble 102. However, the timing diagram 260 illustrates a 2 nCK gap between the last bit capture 100 and the first bit capture 104. This gap provides sufficient time for the 1.5 nCK postamble 98, but it does not provide sufficient time for the specified duration of 3 nCK allocated for the preamble 102. Thus, a partial preamble 262 having a duration of 1 nCK is included instead of the preamble 102. Furthermore, this gap does not provide sufficient time to reset the DFE buffer 76 by setting the DFE buffer 76 to all high or all low values between the last bit capture 100 and the first bit capture 104. Instead, the reset circuitry 78 may pulse in bits from the DQ in the DFE buffer 76 on edges of the DQS signal between the last bit capture 100 and the first bit capture 104 (during the postamble 98 and/or the partial preamble 262).

If only a single cycle exists between the last bit capture 100 and the first bit capture 104 when a 3 nCK preamble is specified with a 1.5 nCK postamble, the preamble 102 may be completely omitted resulting in the memory device 10 using the timing diagram 230 of FIG. 16.

If no cycles exist between the last bit capture 100 and the first bit capture 104 when a 3 nCK preamble is specified with a 1.5 nCK postamble, the preamble 102 and the postamble 98 may both be completely omitted resulting in the memory device 10 using the timing diagram 200 of FIG. 13.

The foregoing timing diagrams of FIGS. 3-19 are meant to be a non-exclusionary list showing a variety of timing diagrams that may be used by the memory device 10 depending upon gaps between write operations, specified preamble lengths, and specified postamble lengths. For instance, the examples for each of the specified postamble lengths (0.5 and 1.5 nCK) and the specified preamble lengths (1, 2, 3) start with a minimum gap size that enables full specified lengths for preambles and postambles, but larger gaps may be included where additional time occurs between the write operations. Additionally or alternatively, sizes of the postambles and/or preambles may be set to any suitable number. The timing diagrams of FIGS. 3-19 show that the DFE circuitry 52 may be set to adapt to a number of different timings occurring with various different write operations.

Reset Circuitry

Figure 20:
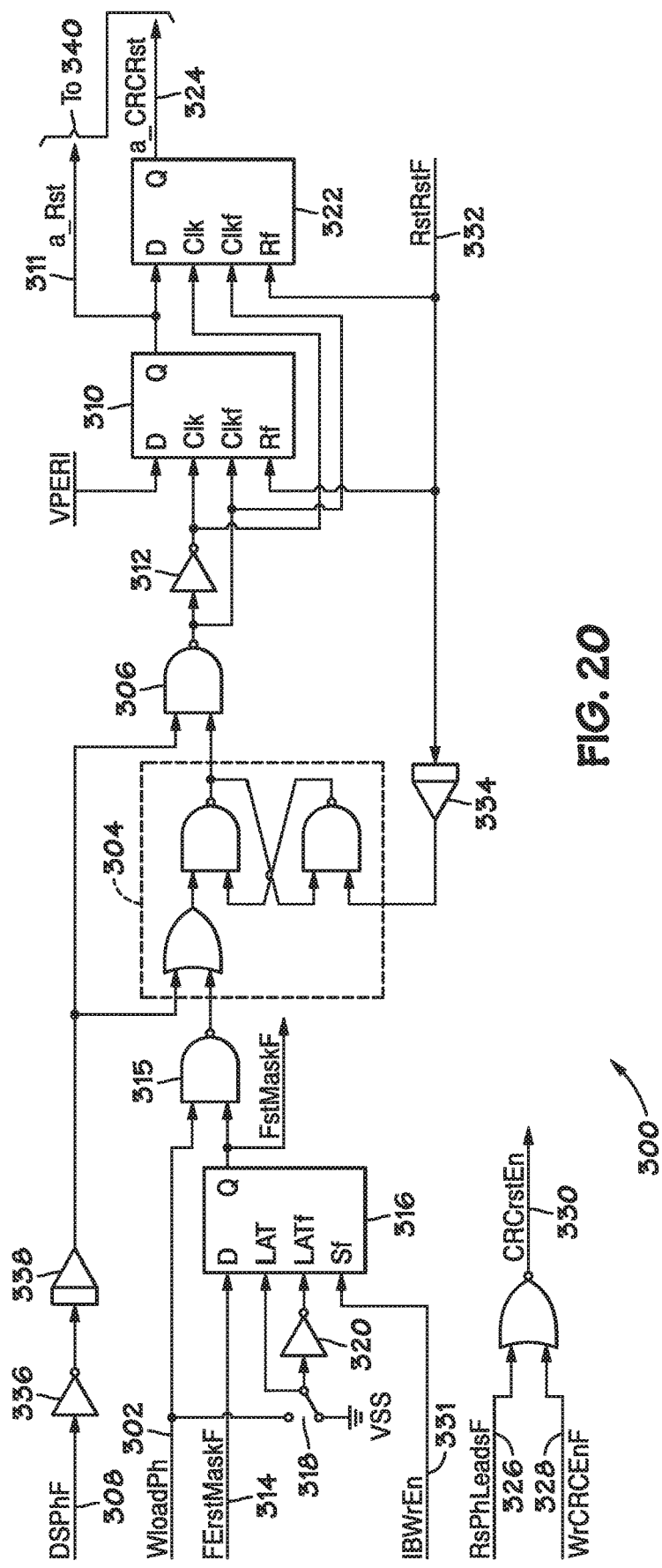
FIG. 20 is a schematic diagram of a first portion of reset circuitry of the DFE circuitry of FIG. 2, in accordance with an embodiment.
Figure 21:
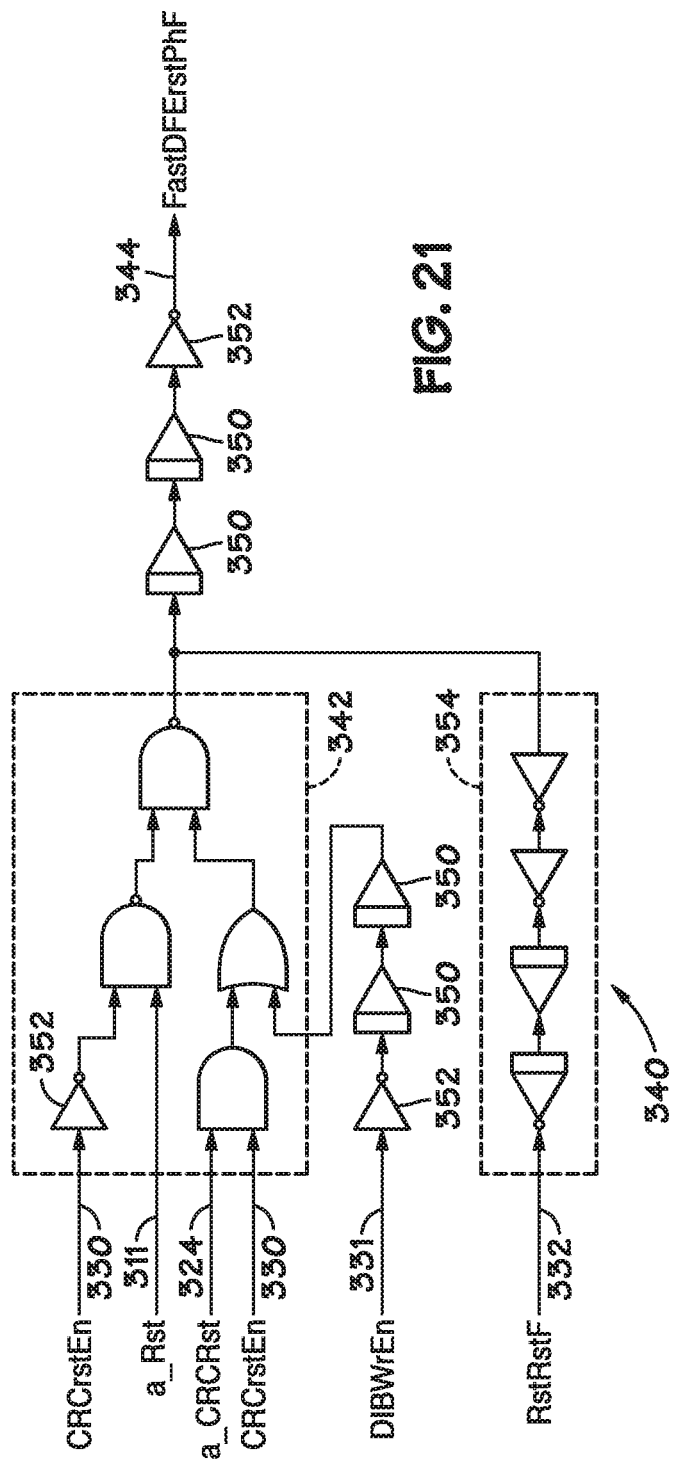
FIG. 21 is a schematic diagram of a second portion of reset circuitry of the DFE circuitry of FIG. 2, in accordance with an embodiment.

FIGS. 20 and 21 illustrate a schematic diagram of an embodiment of the reset circuitry 78 used to selectively reset the DFE buffer 76 of the DFE circuitry 52. FIG. 20 illustrates a schematic of a first portion 300 of the reset circuitry 78. Upon a next-to-last bit of a write burst of a write operation (e.g., write operation 94), a DWloadPh signal 302 is asserted. Assertion of the DWloadPh signal 302 causes clock-gating circuitry 304 to enable a NAND gate 306. The clock-gating circuitry 304 may be used to save power by holding back power from the NAND gate 306 when the DWloadPh signal 302 is asserted. When a last bit of the burst has been captured, a DSphF signal 308 is asserted (e.g., transitions low). Assertion of the DSphF signal 308 causes a flip-flop 310 to set and fire a pulse as an a_Rst signal 311. In some embodiments, an inverter 312 is used to create differential timing for the flip-flop 310 (and/or other flip-flops) from the NAND gate 306.

Firing of the a_Rst signal 311, as previously discussed, may be suppressed when a DFErstMaskF signal 314 is asserted (e.g. transitions low). In some embodiments, the DFErstMaskF signal 314 may pass through a flip-flop 316 that may be optionally placed in a flow-through configuration using a switch 318. An inverter 320 may be included to ensure that differential clocking may be used by the flip-flop 316. In some embodiments, the flip-flop 316 may be omitted.

A cyclic redundancy check (CRC) flip-flop 322 may be included to provide an extra shift from the a_Rst signal 311 to an output a_CRCRst signal 324 for the instances where CRC is enabled. When CRC is enabled, one more DQS cycle occur before the end of the write burst. As discussed in relation to FIG. 21, selection circuitry (e.g., a multiplexer) may be used to select between the a_Rst signal 311 and the a_CRCRst signal 324.

In some embodiments, the DQS signal may be divided into a number (e.g., 4) separate phases. For example, each phase corresponds to every other rising edge or every other falling edge of the DQS. For such 4-phase DQS implementations, the CRC shift may be applied only to the leading phase. To ensure that only the leading phase has the CRC shift added, a ThisPhLeadF signal 326 is used to indicate whether the phase is a leading phase (e.g., the first rising or the first falling edge) of a writing operation. ThisPhLeadF signal 326 and an mrWrCRCEnF signal 328 are submitted to a NOR gate 329 to generate a CRCrstEn signal 330. The mrWrCRCEnF signal 328 is used to indicate whether CRC is enabled for the write operation, and the CRCrstEn signal 330 indicates whether CRC is enabled for the corresponding phase. In other words, for a 4-phase implementation, the reset circuitry 78 (or at least first portion 300 and second portion 340) may be reproduced for each phase of a same type (e.g., rising or falling edge).

In some embodiments, the reset of the DFE buffer 76 may be forced independent of whether a write operation. For instance, a DIBWrEn signal 331 may be provided to force a reset of the DFE buffer 76 when no write operation is in progress or pending.

The first portion 300 may utilize an RstRstF signal 332 to reset the first portion 300. For example, the RstRstF signal 332 may be used to reset the clock-gating circuitry 304, the flip-flop 310, and/or the flip-flop 322 after a width of the pulse from the flip-flop 310 and/or the flip-flop 322 has been passed. To ensure the timing back to the clock-gating circuitry 304, a delay 334 may be used to delay resetting the clock-gating circuitry 304 for some time after the flip-flops 310, 322 are reset.

The a_Rst signal 311, the a_CRCRst signal 324, the CRCrstEn signal 330, and the DIBWrEn signal 331 are passed to a second portion 340 of the reset circuitry 78 as illustrated in FIG. 21. The a_Rst signal 311, the a_CRCRst signal 324, and the CRCrstEn signal 330 are passed to a multiplexer 342 that selects between the a_Rst signal 311 and the a_CRCRst signal 324 using the CRCrstEn signal 330. The DIBWrEn signal 331 forces the multiplexer to output a pulse regardless of the values of a_Rst signal 311, the a_CRCRst signal 324, and the CRCrstEn signal 330. The output from the multiplexer 342 selects an output that eventually becomes the FastDFErstPhF signal 344 of the reset circuitry 78. In some embodiments, the FastDFErstPhF signal 344 and/or other signals, such as the DIBWrEn signal 331, may be delayed using delays 350 and/or inverted using inverters 352.

A feedback path 354 may be used to feedback the RstRstF signal 332. The feedback includes inverters and/or delays and sets the width of the pulse of the FastDFErstPhF signal 344 by delaying the leading edge and feeding it back to the first portion 300 to cause a reset of the FastDFErstPhF signal 344. In other words, the FastDFErstPhF signal 344 is a self-timed pulse that has a duration set by the feedback path 354.

As appreciated, for write operations where the input buffer reset is not suppressed, the DFE buffer 76 is to be reset very quickly after the capture of the last bit of a write burst. If the reset is not suppressed, the reset may have as few as 1.5 cycles to receive the first "conditioning" bit captured by a 2nd rising edge of the DQS after a write operation's last captured using a falling edge. In this timing scenario, 2 conditioning bits may be captured from the data line. To ensure timeliness of the reset or suppression, the reset circuitry 78 passes such signals using the first and second portions 300, 340.

Figure 22:
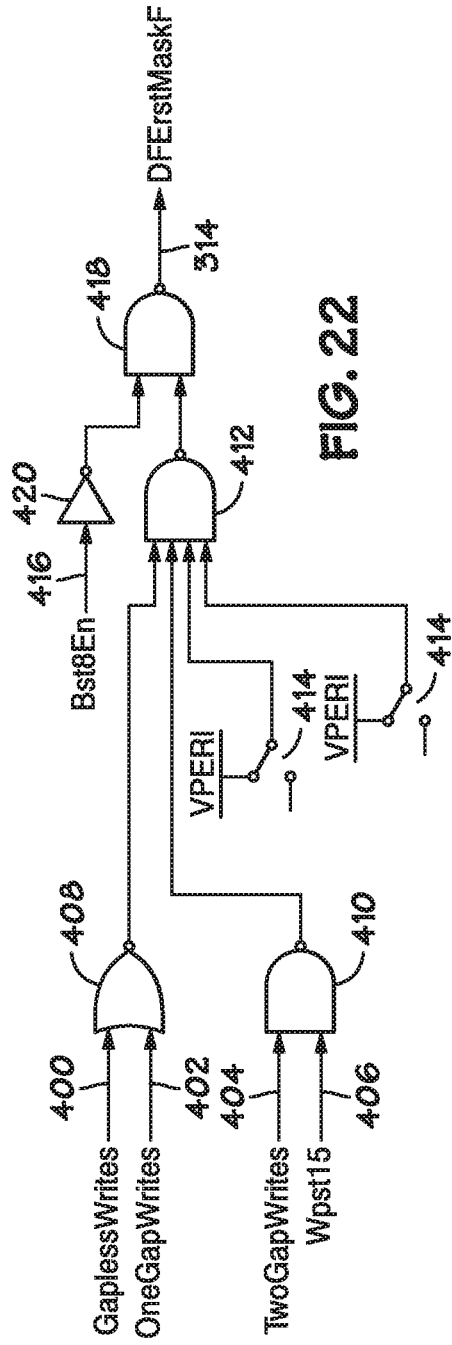
FIG. 22 is a schematic diagram of suppression circuitry of the DFE circuitry of FIG. 2, in accordance with an embodiment.

FIG. 22 illustrates a schematic diagram of the suppression circuitry 80. As illustrated, the suppression circuitry 80 generates the DFErstMaskF signal 314 used by the first portion 300 to control suppression of the reset of the input DFE buffer 76. The suppression circuitry 80 may receive a GaplessWrites signal 400 that indicates when there are no gaps in the data between consecutive writes. The suppression circuitry 80 may also receive a OneGapWrites signal 402 that indicates when there is one gap in the data between consecutive writes. Similarly, the suppression circuitry 80 receives a TwoGapWrites signal 404 that indicate when there is two gaps in the data between consecutive writes. Additionally, the suppression circuitry 80 receives a WPst15 signal that indicates when the memory device 10 has been programmed to a 1.5 cycle write preamble setting by a host device.

The GaplessWrites signal 400 and the OneGapWrites signal 402 are submitted to a NOR gate 408. Similarly, the TwoGapWrites signal 404 and the WPst15 signal 406 are submitted to a NAND gate 410. The output of the NOR gate 408 and the NAND gate 410 are passed to a NAND gate 412 along with optional override signals that may be used to force the output of the NAND gate 412 to a specific value regardless of the values of the GaplessWrites signal 400, the OneGapWrites signal 402, the TwoGapWrites signal 404, and the WPst15 signal 406.

In addition to these signals, the suppression circuitry 80 receives a Bst8En signal 416. The Bst8En signal 416 indicates whether the write data burst length for a write operation has been truncated. For example, if asserted, the Bst8En signal 416 may indicate that only 8 bits are being transmitted instead of a possible 16 bits. Thus, when the Bst8En signal 416 is asserted, the write operation always has enough space to complete the reset. Accordingly, the Bst8En signal 416 may be used to force a condition that DFE buffer 76 resets are never suppressed by the suppression circuitry via the DFErstMaskF signal 314 via the NAND gate 418 and the inverter 420.

Figure 23:
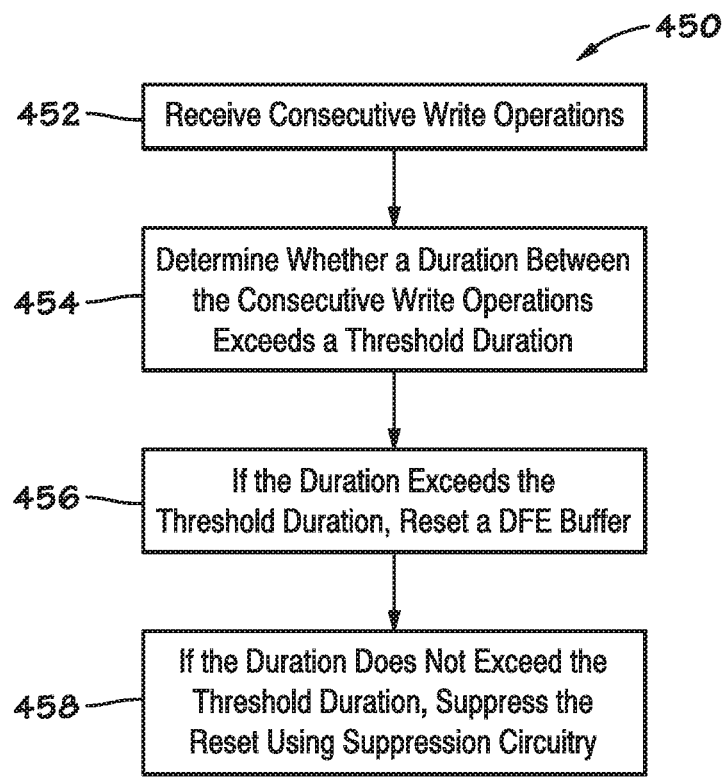
FIG. 23 is a method that may utilize the reset circuitry and/or the suppression circuitry of the DFE circuitry of FIG. 2, in accordance with an embodiment.

FIG. 23 is a flow diagram of a process 450 that may be used by the memory device 10 using the reset circuitry 78 and/or the suppression circuitry 80. The process 450 includes the memory device receiving consecutive write operations (block 452). The memory device 10 then determines whether a duration between the consecutive write operations exceeds a threshold duration (block 454). For example, the suppression circuitry 80 may receive an indication of a number of cycles occurring between the consecutive write operations. The threshold may be a duration that corresponds to whether a reset of the DFE buffer 76 may not occur between the consecutive write operations. If the duration exceeds the threshold, the reset circuitry 78 may reset DFE buffer 76 between the consecutive write operations (block 456). If the duration does not exceed the threshold duration, the suppression circuitry 80 suppresses the reset of the DFE buffer 76 (block 458).

Figure 24A:
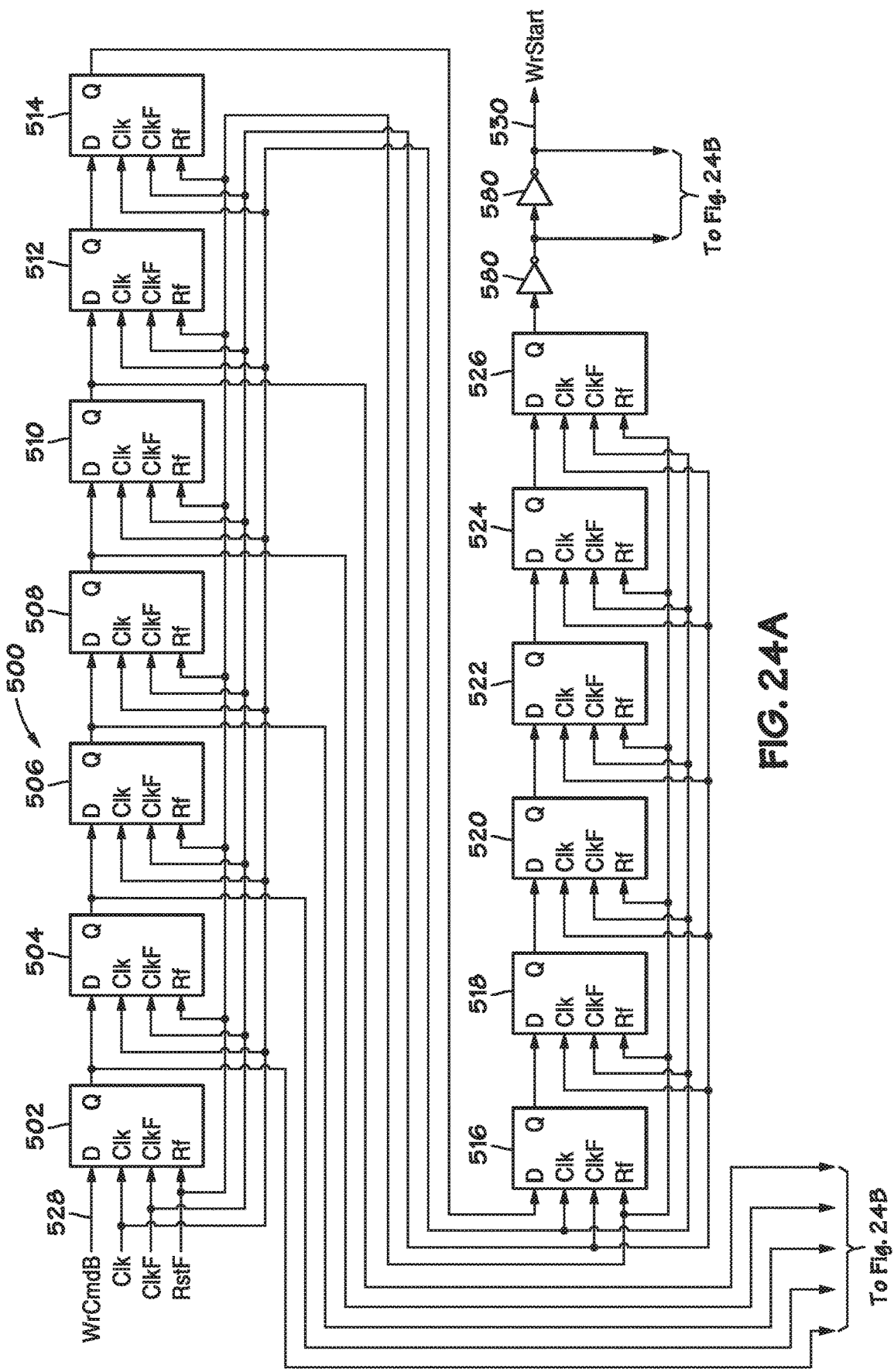
FIG. 24A is a schematic diagram of a first part of generation circuitry used to generate control signals for the suppression circuitry of FIG. 22, in accordance with an embodiment.

FIGS. 24A and 24B illustrate an embodiment of the generation circuitry 82 that may be used to generate the GaplessWrites signal 400, the OneGapWrites signal 402, and the TwoGapWrites signal 404. Thus, the generation circuitry 82 may be used in the suppression/reset of the DFE buffer 76. The GaplessWrites signal 400, the OneGapWrites signal 402, the TwoGapWrites signal 404, and/or other signals generated in the generation circuitry 82 may be used for other purposes as well. For example, such signals may be used for circular write sequences that restart writing data of a subsequent write operation of consecutive write operations without capturing a preamble for the subsequent write operation.

The generation circuitry 82 includes a cas (column access strobe) write latency (CWL) shifter 500. The CWL shifter 500 includes serially-connected flip-flops 502, 504, 506, 508, 510, 512, 514, 516, 518, 520, 522, 524, and 526, collectively referred to as flip-flops 502-526. The CWL shifter 500 may also include one or more other flip-flops to delay received signals (e.g., write commands) by an amount of CWL for the memory device 10. The CWL shifter 500 uses the flip-flops 502-526 to receive a write command as WrCmd13 signal 528. The WrCmd13 signal 528 is a write command passed through the CWL shifter as a received write command delayed by the CWL minus a number of cycles equal to a number of flip-flops included for use in the generation circuitry 82. In the illustrated embodiment, since the illustrated portion of the CWL shifter 500 includes thirteen flip-flops 502-526, the WrCmd13 signal 528 is the delay of an incoming write command delayed by the CWL minus thirteen cycles. After WrCmd13 signal 528 has shifted through the flip-flops 502-528, it is output as a WrStart signal 530. The WrStart signal 530 begins the internal DRAM write operation for the memory device 10.

To determine whether a subsequent write command is shifting through the CWL shifter 500 behind a previous write command, a SloGaplessWrites signal 532 from the CWL shifter 500 that is a number (e.g., 8) stages prior to the WrStart signal 530 in the CWL shifter 500. In some embodiments, the number may be any number that includes a length of the write operation. For instance, for a double-data rate using a pre-fetch (e.g., 16 bits), the number of cycles may be half of the number of bits in the pre-fetch. As illustrated, the SloGaplessWrites signal 532 is captured between flip-flops 510 and 512. When the write commands have no gaps between consecutive write commands, the previous write command has completed shifting through the CWL shifter 500 and has asserted the WrStart signal 530. When no gap occurs between the write operations, the WrStart signal 530 causes a flip-flop 534 to capture the subsequent write command that is the number of stages prior to the WrStart signal 530 in the CWL shifter 500. Capture of the SloGaplessWrites signal 532 causes the flip-flop 534 to assert a GaplessWrites signal 400 absent assertion of a cyclic redundancy check (CRC) discussed below.

Similarly, if the write operations occur with a one-cycle gap between the write operations, a SloOneGapWrites signal 538 between flip-flops 508 and 510 is captured by a flip-flop 540 upon assertion of the WrStart signal 530. Absent CRC assertion, the flip-flop 540 asserts a OneGapWrites signal 402.

Moreover, if the write operations occur with a two-cycle gap between the write operations, a SloTwoGapWrites signal 544 is captured between flip-flops 506 and 508 and captured by a flip-flop 546 upon assertion of the WrStart signal 530. Absent CRC assertion, the flip-flop 546 asserts a TwoGapWrites signal 404. Furthermore, if the write operations occur with a three-cycle gap between the write operations, a SloThreeGapWrites signal 550 between flip-flops 504 and 506 is captured by a flip-flop 552 upon assertion of the WrStart signal 530. Absent CRC assertion, the flip-flop 552 asserts a ThreeGapWrites signal 554.

If four cycles occur between the write operations, a SloFourGapWrites signal 556 from between flip-flops 502 and 504 is captured at a flip-flop 558 based on the WrStart signal 530. This captured value is used when CRC is enabled using a mrWrCRCEn signal 560 used to indicate whether CRC is used for the write operations. Since CRC adds an additional cycle to the write operation (e.g., 18 bits instead of 16 bits), multiplexers 562, 564, 566, and 568 may be used to select between signals based on whether mrWrCRCEn signal 560 indicates that CRC is enabled. In other words, when CRC is included, the multiplexers 562, 564, 566, and 568 cause the assertion of a signal corresponding to a smaller number of writes than captured to account for the additional CRC bit. Thus, the multiplexer 562 outputs the GaplessWrites signal 400 when the SloOneGapWrites signal 538 is captured by the flip-flop 540 and the mrWrCRCEn signal 560 is asserted. Similarly, the multiplexers 564, 566, and 568 shift outputs when the mrWrCRCEn signal 560 is asserted.

In some cases, the write command pulse width at WrCmd13 signal 528 may be more than one cycle wide. This may cause two consecutive stages in the CWL shifter 500 to both be captured by WrStart signal 530. To compensate for this case, NAND gates 570, 572, 574, and 576 may be included to ensure that only a leading stage that is nearest to the WrStart signal 530 is captured while the earlier stage is ignored. The NAND gates 570, 572, 574, and 576 capture only a first cycle of the write operation to avoid incorrectly asserting two outputs at the same time.

The generation circuitry 82 also receives a set signal 578 that sets the flip-flops 534, 540, 546, 552, and 558 in preparation for capturing write operations. The generation circuitry 82 may also include various inverters 580 that are used to amplify signals and/or invert signals for use by logic of the generation circuitry 82. The generation circuitry 82 may also include various other non-illustrated circuitry, such as delay circuitry, that enables proper timing for generation of the GaplessWrites signal 400, OneGapWrites signal 402, TwoGapWrites signal 404, and ThreeGapWrites signal 554.

Suppression of the reset of the DFE buffer 76 is to occur quickly to cut off reset of the DFE buffer 76 quickly after write operation before a next write operation. For example, gapless write operations may have as little as 0.5 cycles to suppress a reset of the DFE buffer 76. To increase the propagation of the GaplessWrites signal 400, OneGapWrites signal 402, TwoGapWrites signal 404, and ThreeGapWrites signal 554, the generation circuitry 82 may utilize a "walkback." As used herein, walkback refers to progressively timed clocks where each clock is a portion of a cycle of the DQS faster than a previous clock.

Figure 25:
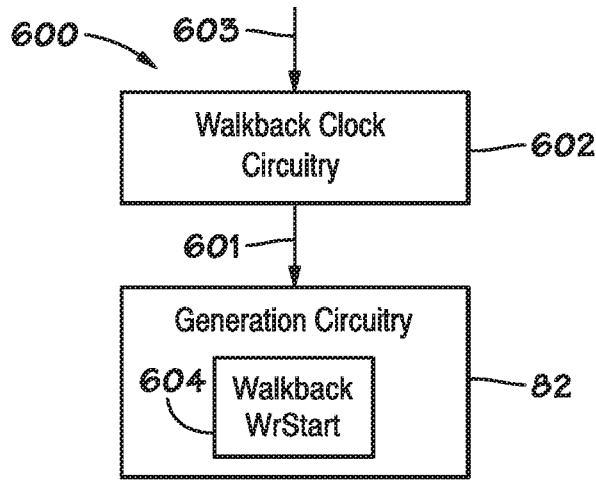
FIG. 25 is a schematic diagram of walkback circuitry that may be used by the memory device to output the control signals of FIGS. 24A and 24B relatively quickly, in accordance with an embodiment.

FIG. 25 illustrates a block diagram of an embodiment of walkback circuitry 600 that includes the generation circuitry 82 that receives one or more walkback clocks 601 from walkback clock circuitry 602 that receives a clock 603 and generates the one or more walkback clocks 601. To accommodate the walkback, the generation circuitry 82 includes walkback WrStart circuitry 604 that walks back the WrStart signal 530 for feedback when capturing the write operations passed through the CWL shifter 500, as illustrated in FIGS. 27A and 27B below.

Figure 26:
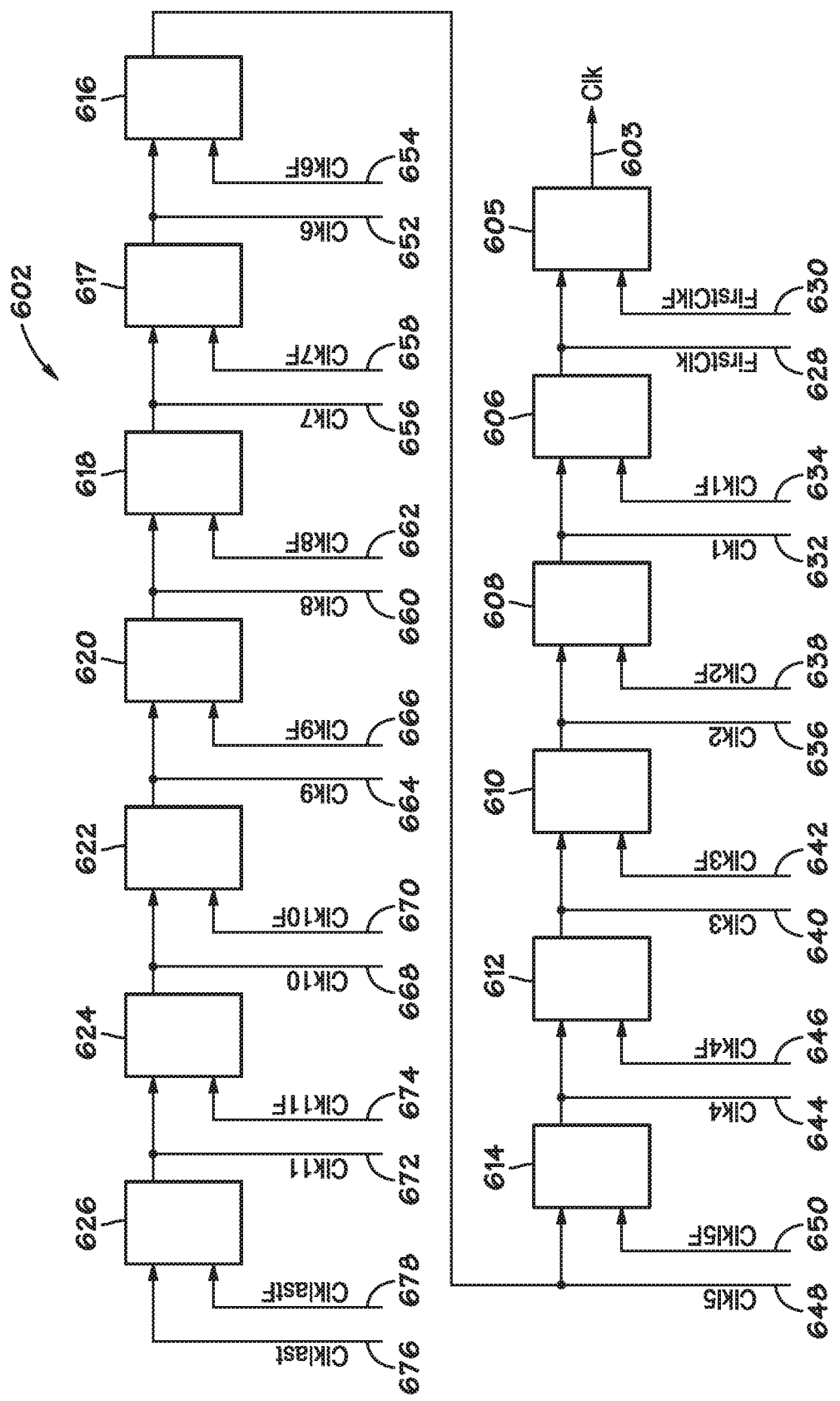
FIG. 26 is a schematic diagram of walkback clock circuitry of the walkback circuitry of FIG. 25, in accordance with an embodiment.

FIG. 26 illustrates a schematic of an embodiment of the walkback clock circuitry 602. As illustrated, the walkback clock circuitry 602 includes latches 605, 606, 608, 610, 612, 614, 616, 617, 618, 620, 622, 624, and 626, collectively referred to as latches 605-626, that incrementally shift the clock 603 by a portion of a cycle through the latches 605-626. In other words, the latch 605 generates a fastclk 628 that is a shifted version of the clock 603 and generates a fastclkF 630 that is an inverted version of the fastclk 628. The latch 606 generates a clk1 632 that is a shifted version of the fastclk 628 and generates a clk1 632 that is an inverted version of the clk1 632. The latch 608 generates a clk2 636 that is a shifted version of the clk1 632 and generates a clk2F 638 that is an inverted version of the clk2 636. The latch 610 generates a clk3 640 that is a shifted version of the clk2 636 and generates a clk3F 642 that is an inverted version of the clk3 640. The latch 612 generates a clk4 644 that is a shifted version of the clk3 640 and generates a clk4F 646 that is an inverted version of the clk4 644. The latch 614 generates a clk5 648 that is a shifted version of the clk4 644 and generates a clk5F 650 that is an inverted version of the clk5 648. The latch 616 generates a clk6 652 that is a shifted version of the clk5 648 and generates a clk6F 654 that is an inverted version of the clk6 652. The latch 617 generates a clk7 656 that is a shifted version of the clk6 652 and generates a clk7F 658 that is an inverted version of the clk7 656. The latch 618 generates a clk8 660 that is a shifted version of the clk7 656 and generates a clk8F 662 that is an inverted version of the clk8 660. The latch 620 generates a clk9 664 that is a shifted version of the clk8 660 and generates a clk9F 666 that is an inverted version of the clk9 664. The latch 622 generates a clk10 668 that is a shifted version of the clk9 664 and generates a clk10F 670 that is an inverted version of the clk10 668. The latch 624 generates a clk11 672 that is a shifted version of the clk10 668 and generates a clk11F 674 that is an inverted version of the clk11 672. The latch 626 generates a Clklast 676 that is a shifted version of the clk11 672 and generates a ClklastF 678 that is an inverted version of the Clklast 676. Each of the clocks generated by the walkback clock circuitry 602 may be used by the generation circuitry 82.

FIGS. 27A and 27B illustrate a schematic diagram of an embodiment of the generation circuitry 82 including the walkback WrStart circuitry 604. As illustrated, the CWL shifter 500 utilizes respective walkback clocks 601 at each stage to shift the write command through the CWL shifter 500 rather than a single clock as illustrated in FIGS. 24A and 24B. In other words, each stage of the CWL shifter 500 in FIGS. 27A and 27B occurs sooner relative to a cycle of the clock 603 than a next stage occurs relative to a next cycle of the clock 603. Thus, walkback clocks 601 used closer to the left of the CWL shifter 500 are "slower" than walkback clocks 601 used closer to the right end of the CWL shifter 500. Using the walkback techniques enables proper latching of the write gap signals while enabling the write gap signals and the WrStart signal 530 to be output much faster than without walkback. To provide walkback capability the final stages of the CWL shifter 500 are driven by the fastest clock signal (fastclk 628) and each preceeding stage is driven by a progressively delayed version of that clock signal. Until finally, at the beginning of this CWL shifter 500, the clock timing has been slowed enough to closely align with the incoming (relatively slow) inputs that load into the start of the CWL shifter 500. For example, a delay (e.g., 2 ns) may be included in the data that the clock 603 captures due to a command decoding delay that has slowed the clock 603. The slow edge (i.e., Clklast 676) of the walkback clocks 601 may be used to match the delays in the data.

Furthermore, to ensure that the write gap signals are properly latched using a walkback configuration, the walkback delays for the walkback clock circuitry 602 is replicated by the walkback WrStart circuitry 604 to walkback the WrStart signal 530 to latch the selected CWL stage outputs as previously described.

In some implementations, a signal that occurs before the WrStart signal 530 may be used for latching. For example, a signal occurring a number (e.g., 1) of cycles before the WrStart signal 530 may be used for latching instead of using the WrStart signal 530. Indeed, any stage may be used to provide a final latching, as long as the relative number of preceding stages is maintained to provide correct spacing to detect gapless writes (e.g., 8 stages) and one-gap writes (e.g., 9 stages) and the other gap writes previously discussed. By using an earlier stage than the final (e.g., WrStart signal 530) the gap write signals are asserted earlier relative to the WrStart signal 530 to allow more time for them to propagate to their destinations before the WrStart signal 530 begins the internal DRAM write operation.

Figure 28:
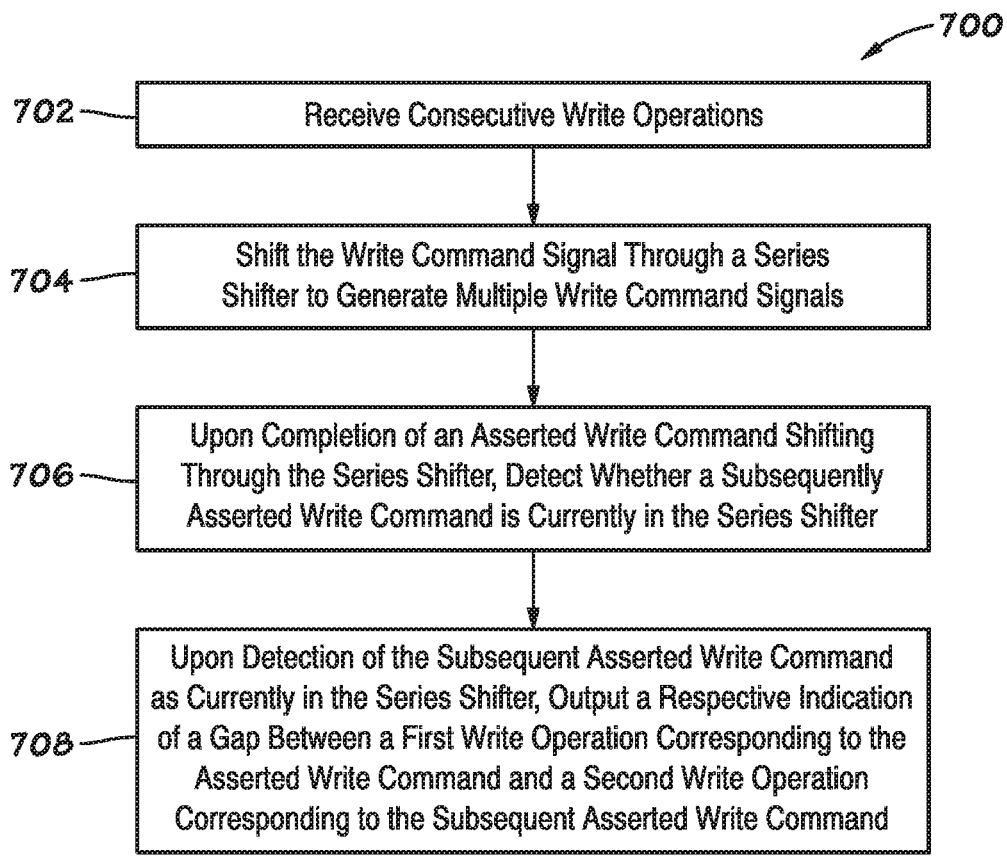
FIG. 28 is a schematic diagram of a process that utilizes the generation circuitry of FIG. 2, in accordance with an embodiment.

FIG. 28 is a flow diagram of a process 700 that may be used by the generation circuitry 82. The generation circuitry 82 receives a write command signal that is configured to indicate whether a write is active for the memory device 10 (block 702). The CWL shifter 500 then shifts through the write command signal to generate multiple write command signal (block 704). When the write command signal is asserted and shifted through the CWL shifter 500, the flip-flops 534, 540, 546, 552, and 558 detect whether a subsequently asserted write command is currently in the CWL shifter 500 (block 706). Upon detection of the subsequently asserted write command as currently in the CWL shifter, one of the flip-flops 534, 540, 546, 552, and 558 outputs an indication of a gap between a first write operation corresponding to the asserted write command and a second write operation corresponding to the subsequently asserted write command (block 708).

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a shifter that is configured to receive a write command and is configured to produce a plurality of shifted write commands from the write command; and
a plurality of flip-flops that is configured to receive a subset of the plurality of shifted write commands from the shifter and to output an indication of whether subsequent write commands subsequent to the write command are asserted when the write command has shifted through an entire length of the shifter and is output from the shifter as a write start signal.

2. The memory device of claim 1, wherein the shifter comprises a plurality of shifter flip-flops connected in series, and each of the plurality of shifter flip-flops is configured to produce a respective one of the plurality of shifted write commands.

3. The memory device of claim 2, wherein each of the plurality of shifter flip-flops is coupled to a common clock.

4. The memory device of claim 2, wherein the plurality of shifter flip-flops is coupled to a plurality of clocks.

5. The memory device of claim 4, comprising walkback circuitry, wherein each of the clocks of the plurality of clocks is generated using the walkback circuitry, and the plurality of clocks are progressively faster relative to a data strobe (DQS) through the shifter.

6. The memory device of claim 5, wherein the walkback circuitry comprises a series of latches.

7. The memory device of claim 6, wherein each of the latches in the series of latches produces a clock of the plurality of clocks and an inverse clock that is logically inverse to a respective clock of the plurality of clocks.

8. The memory device of claim 6, comprising walkback write start circuitry, wherein the walkback write start circuitry comprises an additional series of latches to delay the write start signal from causing the plurality of flip-flops to output the indication.

9. The memory device of claim 8, wherein latches in the additional series of latches each has a similar delay to a respective latch of the series of latches.

10. The memory device of claim 1, wherein the indication comprises a plurality of signals each indicating whether the write start signal and an asserted subsequent write command of the subsequent write commands has a particular duration between the write start signal and an asserted subsequent write command.

11. The memory device of claim 10, wherein the particular duration for a respective signal of the plurality of signals comprises:

a gap duration between a first write operation corresponding to the write start signal and a second write operation corresponding to the asserted subsequent write command; and a write duration comprising a number of cycles for which data for the write operation is transferred.

12. The memory device of claim 1, comprising a cas write latency shifter that comprises the shifter.

13. A method comprising:
receiving a write command signal configured to indicate whether a write is active for a memory device;
shifting the write command signal through a series shifter to generate a plurality of write command signals;
upon completion of an asserted write command shifting through the series shifter, detecting whether a subsequent asserted write command is currently in the series shifter using a plurality of flip-flops configured to receive a subset of the write command signals from the shifter; and
upon detection of the subsequent asserted write command as currently in the series shifter, outputting a respective indication of a gap between a first write operation corresponding to the asserted write command and a second write operation corresponding to the subsequent asserted write command.

14. The method of claim 13, wherein the gap corresponds to a number of flip-flops in the series shifter between the asserted write command and the subsequent asserted write command minus a length of a write burst for the first write operation.

15. The method of claim 13, comprising receiving a cyclic redundancy check (CRC) signal indicative of whether CRC is active for the first write operation.

16. The method of claim 15, wherein the respective indication of the gap is based at least in part on the CRC signal.

17. A memory device comprising:
a first plurality of flip-flops that is configured to receive a write command signal and is configured to produce a plurality of shifted write command signals from the write command signal;
a second plurality of flip-flops that is configured to receive a subset of the plurality of shifted write command signals from the first plurality of flip-flops and to output an indication of whether subsequent write commands subsequent to the subset of the write command signal are asserted when an asserted write command signal has shifted through an entire length of the first plurality of flip-flops and is output from the first plurality of flip-flops as a write start signal; and
a plurality of multiplexers each coupled to outputs of a pair of adjacent flip-flops of the second plurality of flip-flops, wherein each multiplexer of the plurality of multiplexers is configured to select one of the outputs of the pair of adjacent flip-flops based at least in part on a cyclic redundancy check (CRC) signal.

18. The memory device of claim 17, comprising a plurality of NAND gates configured to ensure that only one of the flip-flops of the second plurality of flip-flops is configured to output an asserted indication in response to the write start signal.

19. The memory device of claim 17, comprising write start signal walkback circuitry comprising a first plurality of latches connected in series to provide a plurality of delayed versions of the write start signal to the second plurality of flip-flops.

20. The memory device of claim 19, comprising walkback circuitry comprising a second plurality of latches connected in series to provide a plurality of clocks to the first plurality of flip-flops, wherein each latch in the second plurality of latches has a same delay as a corresponding latch in the first plurality of latches.

* * * * *